(12) United States Patent
Negishi et al.

(10) Patent No.: US 10,281,518 B2
(45) Date of Patent: May 7, 2019

(54) SYSTEMS AND METHODS FOR ON-WAFER DYNAMIC TESTING OF ELECTRONIC DEVICES

(71) Applicant: Cascade Microtech, Inc., Beaverton, OR (US)

(72) Inventors: Kazuki Negishi, Beaverton, OR (US); Eric Hill, Portland, OR (US)

(73) Assignee: FormFactor Beaverton, Inc., Beaverton, OR (US)

( * ) Notice: Subject to any disclaimer, the term of this patent is extended or adjusted under 35 U.S.C. 154(b) by 908 days.

(21) Appl. No.: 14/625,385

(22) Filed: Feb. 18, 2015

(65) Prior Publication Data

US 2015/0241472 A1 Aug. 27, 2015

Related U.S. Application Data

(60) Provisional application No. 61/944,461, filed on Feb. 25, 2014.

(51) Int. Cl.
*G01R 1/04* (2006.01)
*G01R 31/26* (2014.01)
*G01R 31/28* (2006.01)

(52) U.S. Cl.
CPC ..... *G01R 31/2601* (2013.01); *G01R 31/2889* (2013.01)

(58) Field of Classification Search
CPC ............ G01R 31/2887; G01R 31/2889; G01R 31/2891; G01R 31/2601; G01R 31/26

(Continued)

(56) References Cited

U.S. PATENT DOCUMENTS 1,337,866 A 4/1920 Whitaker
2,142,625 A 1/1939 Zoethout
(Continued)

FOREIGN PATENT DOCUMENTS

JP 2011138865 7/2011
JP 2012058225 3/2012
TW 201310039 3/2013

OTHER PUBLICATIONS

English-language abstract of Japanese Patent Application No. 2012058225, Mar. 22, 2012.

(Continued)

*Primary Examiner* — Christopher P McAndrew
(74) *Attorney, Agent, or Firm* — Dascenzo Intellectual Property Law, P.C.

(57) ABSTRACT

Systems and methods for on-wafer dynamic testing of electronic devices. The systems include a probe head assembly, a probe-side contacting structure, a chuck, and a chuck-side contacting structure. The probe head assembly includes a probe configured to electrically contact a first side of a device under test (DUT). The probe-side contacting structure includes a probe-side contacting region. The chuck includes an electrically conductive support surface configured to support a substrate that includes the DUT and to electrically contact a second side of the DUT. The probe head assembly and the chuck are configured to translate relative to one another to selectively establish electrical contact between the probe and the DUT. The chuck-side contacting structure includes a chuck-side contacting region that is in electrical communication with the electrically conductive support surface and opposed to the probe-side contacting structure. The methods may include methods of operating the system or systems.

21 Claims, 7 Drawing Sheets

(58) Field of Classification Search
USPC .................................................. 324/750.24
See application file for complete search history.

(56) References Cited

U.S. PATENT DOCUMENTS

| | | | |
|---|---|---|---|
| 2,197,081 A | 4/1940 | Piron | |
| 2,376,101 A | 5/1945 | Tyzzer | |
| 2,389,668 A | 11/1945 | Johnson | |
| 2,471,697 A | 5/1949 | Rappl | |
| 2,812,502 A | 11/1957 | Doherty | |
| 3,176,091 A | 3/1965 | Hanson et al. | |
| 3,185,927 A | 5/1965 | Margulis et al. | |
| 3,192,844 A | 7/1965 | Szasz et al. | |
| 3,193,712 A | 7/1965 | Harris | |
| 3,201,721 A | 8/1965 | Voelcker | |
| 3,230,299 A | 1/1966 | Radziejowski | |
| 3,256,484 A | 6/1966 | Terry | |
| 3,265,969 A | 8/1966 | Catu | |
| 3,289,046 A | 11/1966 | Carr | |
| 3,333,274 A | 7/1967 | Forcier | |
| 6,127,831 A | 10/2000 | Khoury et al. | |
| 6,838,890 B2 | 1/2005 | Tervo et al. | |
| 7,119,566 B2 | 10/2006 | Kim | |
| 7,221,172 B2 | 5/2007 | Dunklee | |
| 7,250,779 B2 | 7/2007 | Dunklee et al. | |
| 7,468,609 B2* | 12/2008 | Dunklee | G01R 31/2886 324/754.05 |
| 7,629,804 B2* | 12/2009 | Nguyen | G01R 1/06727 324/750.16 |
| 7,952,373 B2* | 5/2011 | Mok | G01R 1/07342 324/750.24 |
| 7,960,981 B2* | 6/2011 | Strom | G01R 3/00 324/750.16 |
| 7,969,172 B2* | 6/2011 | Tanaka | G01R 31/2891 324/754.08 |
| 7,977,956 B2* | 7/2011 | Breinlinger | G01R 31/2891 324/750.16 |
| 8,130,004 B2* | 3/2012 | Yamada | G01R 31/2891 324/750.16 |
| 8,154,119 B2* | 4/2012 | Yoon | H01L 23/04 257/698 |
| 8,222,912 B2* | 7/2012 | Dang | G01R 1/0675 324/750.15 |
| 8,587,331 B2 | 11/2013 | Berry et al. | |
| 8,981,809 B2* | 3/2015 | Rathburn | G01R 1/0466 257/727 |
| 9,069,008 B2* | 6/2015 | Yasuta | G01R 1/0408 |
| 9,316,685 B2* | 4/2016 | Ku | G01R 31/2889 |
| 9,429,617 B2* | 8/2016 | Tseng | G01R 31/2635 |
| 2002/0031849 A1* | 3/2002 | Maruyama | G01R 31/2891 438/14 |
| 2002/0063558 A1* | 5/2002 | Takeuchi | G01R 31/2889 324/757.04 |
| 2005/0253613 A1* | 11/2005 | Komatsu | G01R 31/2891 324/750.22 |
| 2005/0275398 A1* | 12/2005 | Yamashita | G01R 31/2851 324/750.03 |
| 2007/0205784 A1* | 9/2007 | Dunklee | G01R 31/2886 324/754.05 |
| 2008/0079453 A1 | 4/2008 | Lee | |
| 2008/0315903 A1 | 12/2008 | Schmidt et al. | |
| 2009/0153167 A1* | 6/2009 | Stewart | G01R 31/2887 324/754.08 |
| 2011/0063772 A1 | 3/2011 | Steger | |
| 2011/0223778 A1* | 9/2011 | Chow | H01L 21/4853 439/66 |
| 2012/0126230 A1* | 5/2012 | Fournel | H01L 25/0657 257/48 |
| 2013/0015871 A1* | 1/2013 | Cleary | G01R 31/2884 324/754.03 |
| 2013/0154678 A1* | 6/2013 | Nelson | G01R 1/0408 324/754.24 |
| 2013/0241588 A1* | 9/2013 | Yamada | G01R 31/2601 324/750.24 |
| 2013/0249581 A1* | 9/2013 | Miyazono | G01R 31/2601 324/750.22 |
| 2014/0002122 A1* | 1/2014 | Dibattista | G01R 31/318511 324/750.24 |

OTHER PUBLICATIONS

English-language abstract of Japanese Patent Application No. 2011138865, Jul. 14, 2011.
English-language abstract of Taiwan Patent No. 201310039, Mar. 1, 2013.

* cited by examiner

SYSTEMS AND METHODS FOR ON-WAFER DYNAMIC TESTING OF ELECTRONIC DEVICES

RELATED APPLICATION

This application claims priority to U.S. Provisional Patent Application No. 61/944,461, which was filed on Feb. 25, 2014, and the complete disclosure of which is hereby incorporated by reference.

FIELD OF THE DISCLOSURE

The present disclosure relates generally to on-wafer testing of electronic devices and more particularly to high-current and/or high-voltage on-wafer dynamic testing of electronic devices.

BACKGROUND OF THE DISCLOSURE

Electronic devices, such as vertical structure devices, power control devices, high-current diodes, high-current metal oxide semiconductor field effect transistors (MOSFETs), high-current insulated gate bipolar transistors (IGBTs), and/or high-current bipolar junction transistors (BJTs), often may be utilized to control and/or regulate flow and/or delivery of electric voltage and/or current. The electronic devices may be fabricated on a substrate, such as a semiconductor wafer. Subsequently, the electronic devices may be singulated from the substrate and packaged for use by an integrator, consumer, or other intermediate or end user. This packaging may include combining a plurality of individual electronic devices into a packaged assembly.

Conventionally, the operation of the electronic devices may not be verified and/or tested until the plurality of individual electronic devices is packaged into the packaged assembly. Under these conditions, a malfunction in one or more of the plurality of individual electronic devices may make the entire packaged assembly unusable. Thus, extensive rework may be required to replace the malfunctioning electronic device. Alternatively, the entire packaged assembly may be scrapped or otherwise discarded.

With this in mind, it may be desirable to test the operation of electronic devices prior to singulation of the electronic devices from the substrate and/or prior to assembly of the plurality of individual electronic devices into the packaged assembly. However, this testing may require the supply of large electric currents, such as electric currents on the order of hundreds, or even thousands, of amperes, to the electronic devices. In addition, accurate characterization of the switching performance of the electronic device often is desired. This may require dynamic testing of the electronic devices. Dynamic testing may include pulsing of the electric current and/or switching of the electric current on and off at a relatively high rate, or frequency.

Under these conditions, an inductance of the components of a test system that are utilized to provide the electric current to the electronic device and/or to receive the electric current from the electronic device may produce significant voltage drops within the test system. This may limit testing accuracy, may limit a magnitude of the electric current that may be provided by the test system, and/or may limit a rate of change (i.e., a time derivative) of the electric current that may be provided by the test system. Furthermore, conventional test systems generally are unable to dynamically provide the large electric currents needed to characterize the operation of certain electronic devices, such as power control devices. Thus, there exists a need for improved systems and methods for on-wafer dynamic testing of electronic devices.

SUMMARY OF THE DISCLOSURE

Systems and methods for on-wafer dynamic testing of electronic devices are disclosed. The systems include a probe head assembly, a probe-side contacting structure, a chuck, and a chuck-side contacting structure. The probe head assembly includes a probe configured to electrically contact a first side of a device under test (DUT). The probe-side contacting structure includes a probe-side contacting region. The chuck includes an electrically conductive support surface configured to support a substrate that includes the DUT and to electrically contact a second side of the DUT. The probe head assembly and the chuck are configured to translate relative to one another to selectively establish electrical contact between the probe and the DUT. The chuck-side contacting structure includes a chuck-side contacting region that is in electrical communication with the electrically conductive support surface and opposed to the probe-side contacting structure. The probe-side contacting structure and the chuck-side contacting structure are configured to selectively establish electrical communication therebetween.

The methods include locating the substrate on the electrically conductive support surface and electrically contacting the second side of the DUT with the electrically conductive support surface. The methods further include electrically contacting the probe with the first side of the DUT. The methods also include electrically contacting the probe-side contacting structure with the chuck-side contacting structure. The methods further include providing an electric current to one of the probe and the probe-side contacting structure and receiving the electric current from the other of the probe and the probe-side contacting structure.

DETAILED DESCRIPTION AND BEST MODE OF THE DISCLOSURE

Figure 1:
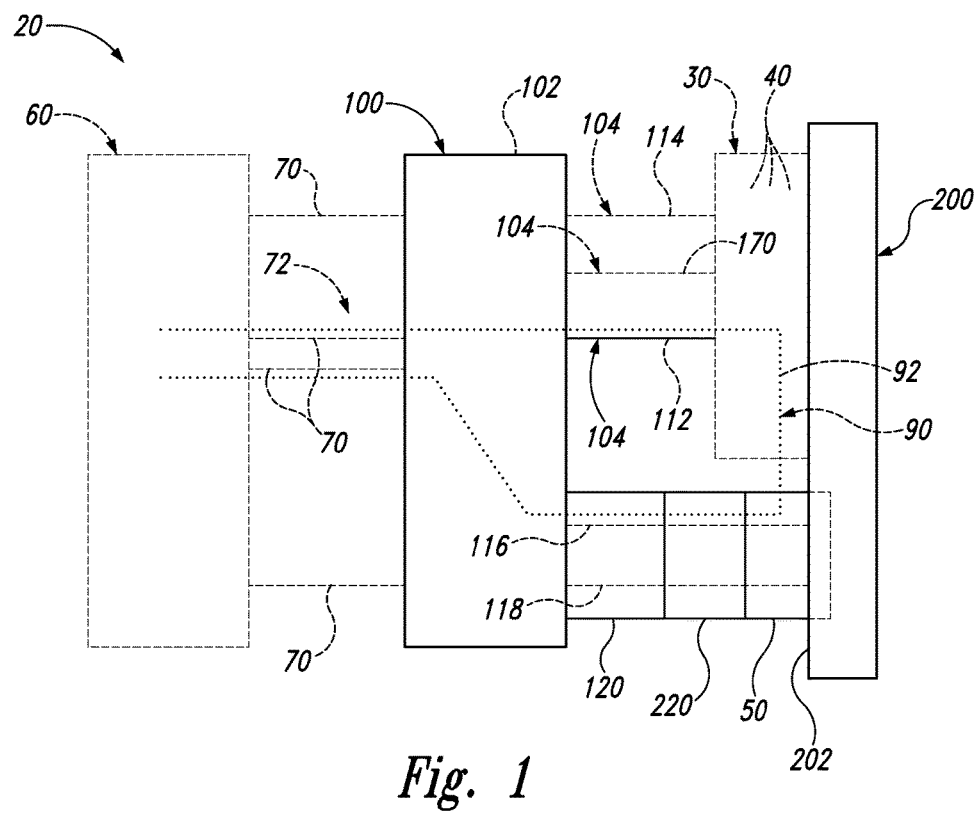
FIG. 1 is a schematic representation of examples of a test system according to the present disclosure.

FIGS. 1-13 provide examples of test systems 20, of components thereof, and/or of methods, according to the present disclosure, for on-wafer dynamic testing of a device under test. Elements that serve a similar, or at least substantially similar, purpose are labeled with like numbers in each of FIGS. 1-13, and these elements may not be discussed in detail herein with reference to each of FIGS. 1-13. Similarly, all elements may not be labeled in each of FIGS. 1-13, but reference numerals associated therewith may be utilized herein for consistency. Elements, components, features, and/or steps that are discussed herein with reference to one or more of FIGS. 1-13 may be included in and/or utilized with any of FIGS. 1-13 without departing from the scope of the present disclosure.

In general, elements that are likely to be included in a given (i.e., a particular) embodiment are illustrated in solid lines, while elements that are optional to a given embodiment are illustrated in dashed lines. However, elements that are shown in solid lines are not essential to all embodiments, and an element shown in solid lines may be omitted from a given embodiment without departing from the scope of the present disclosure.

FIG. 1 is a schematic representation of examples of a test system 20, according to the present disclosure, for on-wafer dynamic testing of electronic devices. Test system 20 includes a probe head assembly 100 that includes a probe 104 that is configured to electrically contact a device under test (DUT) 40 (i.e., an electronic device) that is located on, formed on, and/or forms a portion of, a substrate 30. Test system 20 further includes a chuck 200 that includes a conductive support surface 202 that is configured to support substrate 30.

In the systems and methods according to the present disclosure, test system 20 may be configured to form an electrical circuit 90 that includes probe head assembly 100, probe 104, DUT 40, and an intermediate structure 50. Electrical circuit 90 may permit an electric current 92 to flow from probe head assembly 100 through probe 104, DUT 40, and intermediate structure 50, and back to probe head assembly 100.

Electric current 92 may be provided to probe head assembly 100 from any suitable source. As an example, test system 20 further may include and/or be in electrical communication with a signal generation and analysis assembly 60 that may be configured to generate electric current 92, to provide electric current 92 to probe head assembly 100 and/or to receive electric current 92 from probe head assembly 100, such as via one or more electrical conduits 70.

It is within the scope of the present disclosure that electric current 92 may flow within circuit 90 in any suitable direction. As an example, electric current 92 may be provided such that the electric current flows from DUT 40 to intermediate structure 50. As another example, electric current 92 may be provided such that the electric current flows from intermediate structure 50 to DUT 40.

As illustrated in dashed lines in FIG. 1, probe head assembly 100 may include a probe head 102 that includes a plurality of probes 104. As an example, test system 20 may be configured to form a four-point, four-terminal (i.e. a quasi-Kelvin), connection with DUT 40. Under these conditions, a first probe 112 may be configured to form an electrical contact with DUT 40 and to permit electric current 92 to flow between DUT 40 and probe head assembly 100. First probe 112 additionally or alternatively may be referred to herein as a force signal probe 112, a force signal supply probe 112, a force signal receipt probe 112, and/or as a first force signal probe 112. In addition, a second probe 114 may be configured to measure a voltage of a portion of DUT 40 that is contacted by first probe 112. Second probe 114 additionally or alternatively may be referred to herein as a sense signal probe 114 and/or as a first sense probe 114.

Test system 20 further includes a probe-side contacting structure 120 and a chuck-side contacting structure 220. Probe-side contacting structure 120 and chuck-side contacting structure 220 may, individually and/or cooperatively, be configured to form one or more electrical connections between intermediate structure 50 and probe head assembly 100. The one or more electrical connections may include and/or be selectively established during operation of test system 20, as discussed in more detail herein. Contacting structures 120/220 may include and/or be any suitable structure. Examples of contacting structures 120/220 are discussed in more detail herein.

As an example, probe-side-contacting structure 120 and/or chuck-side contacting structure 220 may be configured to form a first electrical connection 116 between intermediate structure 50 and probe head assembly 100 and also to form a second electrical connection 118 between the intermediate structure and the probe head assembly. When test system 20 forms the four-point connection with DUT 40, first electrical connection 116 may be configured to convey electric current 92 between probe head assembly 100 and intermediate structure 50. In addition, second electrical connection 118 may be configured to measure a voltage of an interface between DUT 40 and intermediate structure 50. The four-point connection may be referred to as a quasi-Kelvin connection due to a resistance (such as a contact resistance) that may be present between substrate 30 and intermediate structure 50.

First electrical connection 116 additionally or alternatively may be referred to herein as a force signal electrical connection 116, a force signal supply electrical connection 116, a force signal receipt electrical connection 116, a force signal probe 116, a force signal supply probe 116, a force signal receipt probe 116, and/or a second force signal probe 116. Second electrical connection 118 additionally or alternatively may be referred to herein as sense electrical connection 118 and/or as second sense probe 118.

Intermediate structure 50 may include any suitable structure that may be configured to convey electric current 92 between DUT 40 and probe head assembly 100. As an example, and as discussed in more detail herein with reference to FIGS. 2-12, intermediate structure 50 may include, form a portion of, and/or be chuck 200 and/or electrically conductive support surface 202 thereof, which is why FIG. 1 illustrates intermediate structure 50, in dashed lines, in an overlapping relationship with chuck 200.

As illustrated in dashed lines in FIG. 1, test system 20 further may include a gate biasing probe 170. Gate biasing probe 170 may be configured to provide a gate bias voltage to a transistor gate of DUT 40 that receives electric current 92. This may permit test system 20 to switch the transistor between an electrically insulating state and an electrically conducting state. The electrically insulating state additionally or alternatively may be referred to as an open state and/or an "off" state. The electrically conducting state additionally or alternatively may be referred to as a closed stated and/or an "on" state.

Signal generation and analysis assembly 60 may include any suitable structure that may be configured to provide electric current 92 to probe head assembly 100, to receive electric current 92 from probe head assembly 100, to detect a voltage of second probe 114 and/or of second electrical connection 118, to compare a voltage of two or more probes 104, and/or to test, quantify, and/or measure the operation of DUT 40. As examples, signal generation and analysis assembly 60 may include and/or be a signal generator, a signal analyzer, an impedance analyzer, a network analyzer, a spectrum analyzer, an electric current source, an electric power source, a DC electric current source, an AC electric current source, and/or a switching electric power source.

Electrical conduits 70 may include any suitable structure that may be configured to convey electric current 92 between signal generation and analysis assembly 60 and probe head assembly 100 and/or that may provide one or more electrical connections between signal generation and analysis assembly 60 and probe head assembly 100. As examples, electrical conduits 70 may include and/or be a conductive material, a metallic material, a wire, a plurality of wires, a coaxial cable, a triaxial cable, and/or a transmission line.

As discussed in more detail herein, test systems 20 according to the present disclosure and/or electrical conduits 70 thereof may be configured such that a single transmission line 72 both provides electric current 92 from signal generation and analysis assembly 60 to probe head assembly 100 and returns the electric current to signal generation and analysis assembly 60 from probe head assembly 100. This may improve a quality of electric current 92 and/or may reduce an inductance and/or capacitance of electrical circuit 90 by permitting at least partial cancellation of electric fields that may be generated within electrical conduits 70 by transmission of electric current 92. Examples of transmission lines 72 include any suitable coaxial cable, microstrip, and/or strip line. To further improve this electric field cancellation, electrical conduits 70 may be formed from a non-magnetic material, examples of which include aluminum and/or copper.

Device under test 40 may include any suitable structure that may be foamed on substrate 30, may form a portion of electrical circuit 90, and/or may selectively conduct electric current 92. As examples, device under test 40 may include and/or be a semiconductor device, an electronic device, a power device, a diode, a metal oxide semiconductor field effect transistor, an insulated gate bipolar transistor, and/or a bipolar junction transistor. Device under test 40 may be configured to selectively conduct and/or to operate at an operating current. Examples of operating currents for DUT 40 include operating currents of at least 1 amp (A), at least 5 A, at least 10 A, at least 20 A, at least 30 A, at least 50 A, at least 75 A, at least 100 A, at least 150 A, at least 200 A, at least 300 A, at least 400 A, at least 500 A, at least 600 A, at least 700 A, at least 800 A, at least 900 A, or at least 1000 A.

Substrate 30 may include any suitable structure that may include one or more DUTs 40, may define at least a portion of one or more DUTs 40, and/or may have one or more DUTs 40 formed thereon. As examples, substrate 30 may include and/or be a wafer, a semiconductor wafer, and/or a silicon wafer. Since DUTs 40 are present on substrate 30 during testing thereof, the systems and methods disclosed herein may be referred to as systems and methods for on-wafer dynamic testing of DUTs 40.

Figure 2:
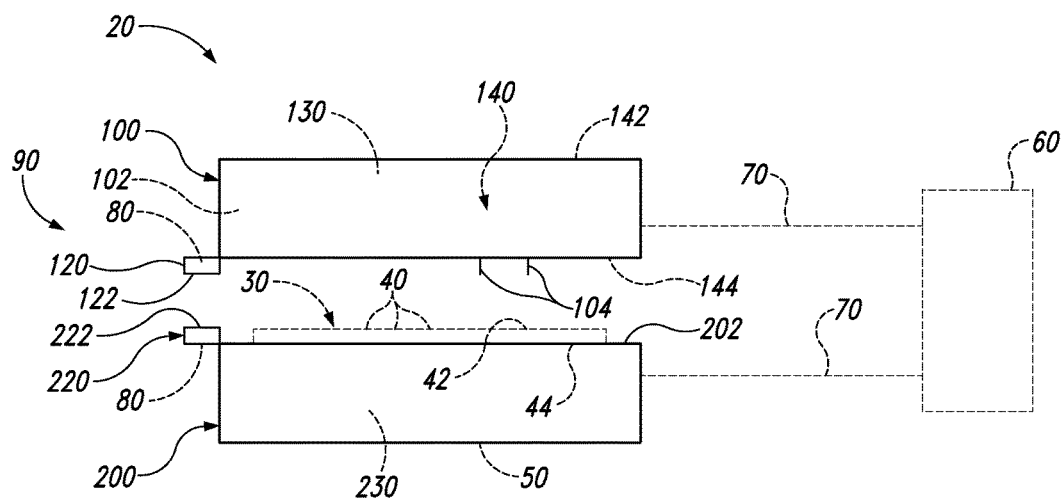
FIG. 2 is a schematic representation of examples of a test system according to the present disclosure.
Figure 5:
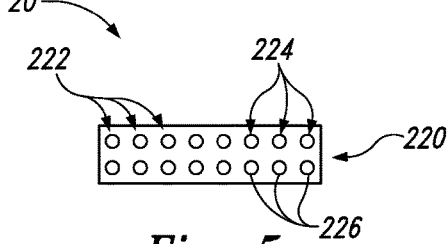
FIG. 5 is a schematic top view of an example of a chuck-side contacting structure according to the present disclosure.
Figure 6:
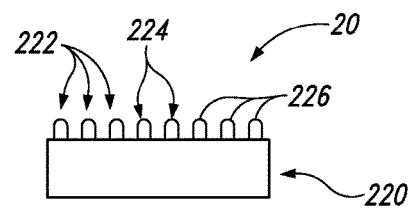
FIG. 6 is a schematic side view of the chuck-side contacting structure of FIG. 5.
Figure 7:
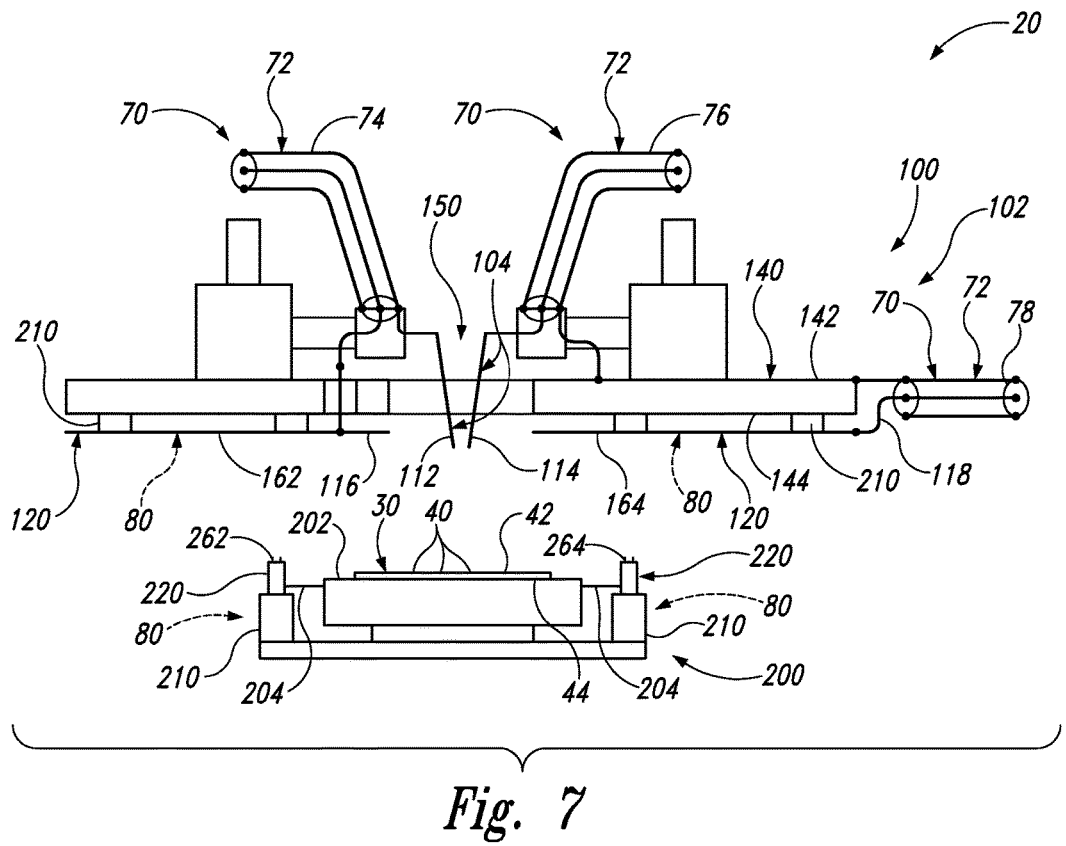
FIG. 7 is a schematic side view of examples of another test system, according to the present disclosure, prior to contact between a probe head assembly and a substrate that is supported by a chuck.
Figure 8:
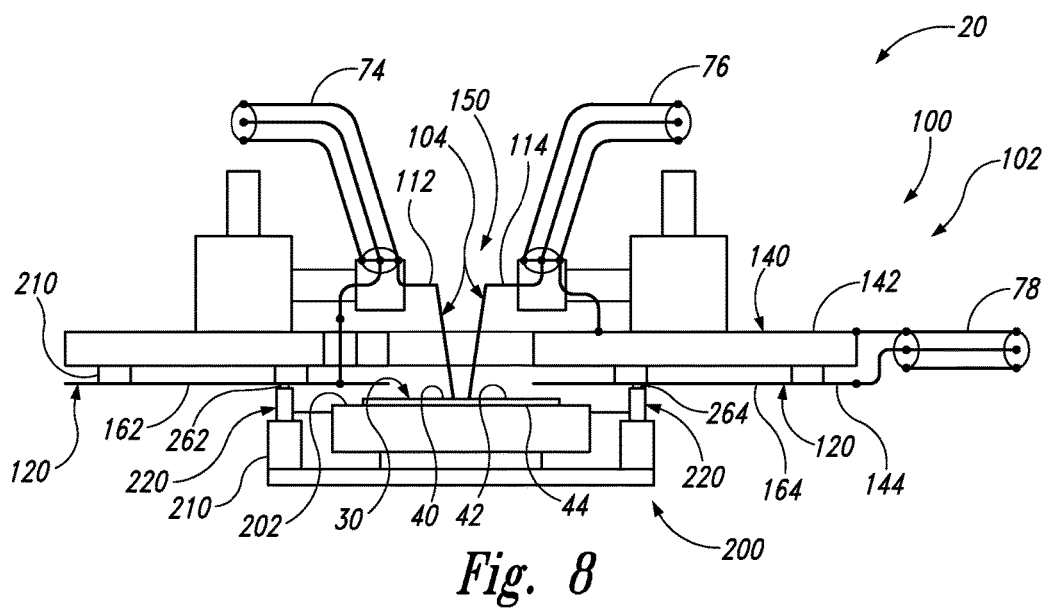
FIG. 8 is a schematic side view of the test system of FIG. 7 subsequent to contact between the probe head assembly and the substrate.

FIGS. 2-12 provide more specific examples of test systems 20 and/or components of test systems 20 according to the present disclosure. Test systems 20 of FIGS. 2-12 may include and/or be test systems 20 of FIG. 1, and any of the components and/or features that are discussed herein with reference to FIG. 1 may be included in and/or utilized with test systems 20 of FIGS. 2-12 without departing from the scope of the present disclosure. Test systems 20 of FIGS. 2-12 may be configured to electrically test a DUT 40. As illustrated in FIGS. 2 and 7-8, DUT 40 defines a first side 42 and a second side 44 that is opposed to the first side and is present and/or formed on a substrate 30, which may include a plurality of DUTs 40.

With reference to FIG. 2, test systems 20 include a probe head assembly 100 that includes a probe 104. Probe 104 is configured to electrically contact first side 42 of DUT 40. Test systems 20 further include a probe-side contacting structure 120 that includes and/or defines a probe-side contacting region 122. Test systems 20 also include a chuck 200 that defines an electrically conductive support surface 202. Electrically conductive support surface 202 is configured to support substrate 30 and to electrically contact second side 44 of DUT 40. Electrically conductive support surface 202 also may be referred to herein as a conductive support surface 202 and/or as a surface 202.

Probe head assembly 100 and chuck 200 are configured to selectively translate relative to one another to selectively establish and/or cease electrical communication, or contact, between probe 104 and DUT 40. This translation may be accomplished via any suitable probe translation structure 130, which may be configured to translate and/or move probe head assembly 100, and/or via any suitable chuck translation structure 230, which may be configured to translate and/or move chuck 200.

Test systems 20 further includes a chuck-side contacting structure 220 that includes and/or defines a chuck-side contacting region 222. Chuck-side contacting structure 220 and/or chuck-side contacting region 222 thereof are in electrical communication with electrically conductive support surface 202. In addition, chuck-side contacting structure 220 is aligned with and/or opposed to probe-side contacting structure 120. Thus, test systems 20 may be configured to selectively establish electrical communication between chuck-side contacting region 222 and probe-side contacting region 122 during operation thereof.

Figure 9:
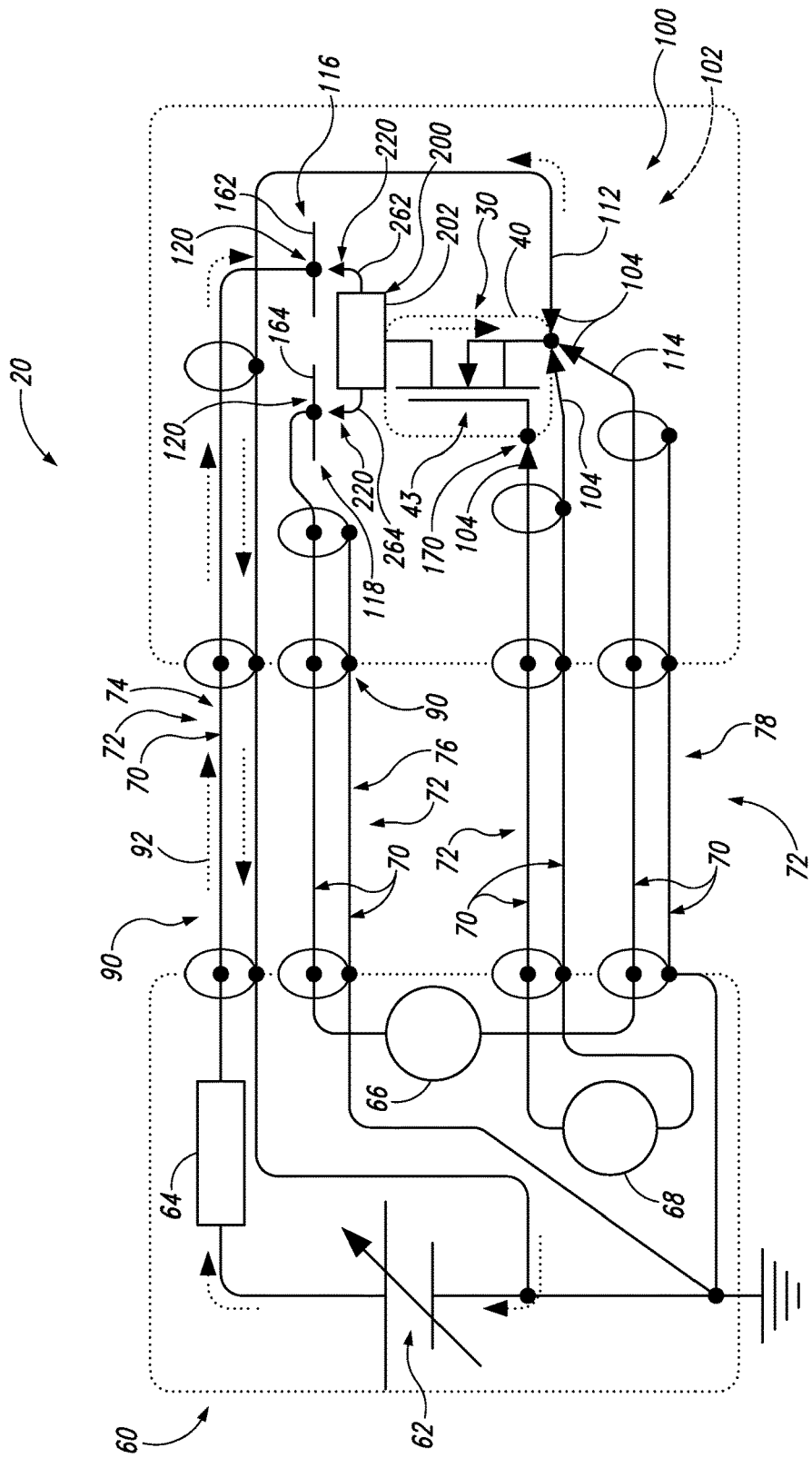
FIG. 9 is a schematic electrical diagram of a test system according to the present disclosure.

When probe 104 is in electrical contact with DUT 40 and chuck-side contacting structure 220 is in electrical contact with probe-side contacting structure 120, test systems 20 may define an electrical circuit 90 (as perhaps illustrated most clearly in FIGS. 1 and 9). Electrical circuit 90 may include probe head assembly 100, including probe 104 thereof, DUT 40, electrically conductive support surface 202, chuck-side contacting structure 220, and probe-side contacting structure 120. Thus, test system 20 may convey one or more electric signals between probe 104 and probe-side contacting structure 120 via DUT 40, electrically conductive support surface 202, and chuck-side contacting structure 220. The electric signals also may be referred to herein as test signals and/or electric currents. Chuck 200 and/or electrically conductive support surface 202 thereof also may be referred to herein as an intermediate structure 50, as discussed herein with reference to FIG. 1.

It is within the scope of the present disclosure that motion of probe head assembly 100 and chuck 200 relative to one another, such as via probe translation structure 130 and/or chuck translation structure 230, may be utilized to form the electrical contact between probe 104 and DUT 40 and also to form the electrical contact between chuck-side contacting structure 220 and probe-side contacting structure 120. However, it is also within the scope of the present disclosure that test system 20 may include a contact engine 80 that is configured to selectively establish electrical contact between chuck-side contacting structure 220 and probe-side contacting structure 120. This contact may be separate and/or independent from electrical contact being established between probe 104 and DUT 40.

Examples of contact engine 80 include any suitable solenoid, piezoelectric device, rotating mechanism, ball screw, rack and pinion assembly, electromechanical contact engine, pneumatic contact engine, and/or hydraulic contact engine. As discussed in more detail herein, contact engine 80 may be utilized to control and/or regulate the contact between chuck-side contacting structure 220 and probe-side contacting structure 120 independent from contact between probe 104 and DUT 40. As an example, contact engine 80 may be utilized to contact the chuck-side contacting structure with the probe-side contacting structure subsequent to contact between the probe and the DUT. As another example, contact engine 80 may be utilized to contact the chuck-side contacting structure with the probe-side contacting structure prior to contact between the probe and the DUT. As yet another example, contact engine 80 may be utilized to withdraw and/or retract chuck-side contacting structure 220 and/or probe-side contacting structure 120, such as to improve and/or facilitate locating substrate 30 on chuck 200 and/or to improve and/or facilitate cleaning of chuck 200 and/or probe head assembly 100.

As illustrated in dashed lines in FIG. 2, test system 20 further may include a signal generation and analysis assembly 60. Signal generation and analysis assembly 60 may be in electrical communication with, may provide an electric current to, may receive an electric current from, and/or may control the operation of probe head 100 and/or chuck 200, such as via one or more electrical conduits 70.

Probe-side contacting structure 120 and/or chuck-side contacting structure 220 may include any suitable structure that may be configured to selectively, repeatedly, and/or reproducibly establish electrical communication and/or an electrical connection therebetween. As an example, probe-side contacting region 122 and chuck-side contacting region 222 may be formed from one or more conductive materials, such as a metal. In such an example, establishing physical contact between the probe-side contacting region and the chuck-side contacting region may establish electrical communication between probe-side contacting structure 120 and chuck-side contacting structure 220.

As an example, probe-side contacting structure 120 and/or chuck-side contacting structure 220 may define a planar contacting surface. As another example, probe-side contacting structure 120 and/or chuck-side contacting structure 220 may be defined by one or more compliant conductive members. As yet another example, one of probe-side contacting structure 120 and chuck-side contacting structure 220 may define the planar contacting surface, while the other of probe-side contacting structure 120 and chuck-side contacting structure 220 may be defined by the one or more compliant conductive members, with the compliant conductive members being configured to electrically contact the planar contacting surface. Examples of compliant conductive members include any suitable flexible conductive member, spring, ball plunger, conductive member that is supported by a compliant material, spring-loaded pin, pogo pin, and/or biased roller assembly.

Regardless of the exact configuration, probe-side contacting region 122 may face toward chuck-side contacting region 222. Similarly, chuck-side contacting region 222 may face toward probe-side contacting region 122. In addition, chuck-side contacting region 222 may face in at least substantially the same direction as electrically conductive support surface 202. Similarly, probe-side contacting region 122 may face in at least substantially the same direction as probes 104 and/or in at least substantially the same direction as a second side 144 of a platen 140 of probe head assembly 100. Stated another way, probe-side contacting region 122 may face toward, or in an opposed direction to, a surface of DUT 40 that is configured to contact probes 104, while chuck-side contacting region 222 may face away from, or in the same direction as, the surface of substrate 30 that is configured to contact probes 104.

It is within the scope of the present disclosure that probe-side contacting region 122 may be operatively attached to, may be in electrical communication with, and/or may form a portion of, probe head assembly 100. Similarly, it is also within the scope of the present disclosure that chuck-side contacting region 222 may be operatively attached to, may be in electrical communication with, and/or may form a portion of, chuck 200.

Figure 3:
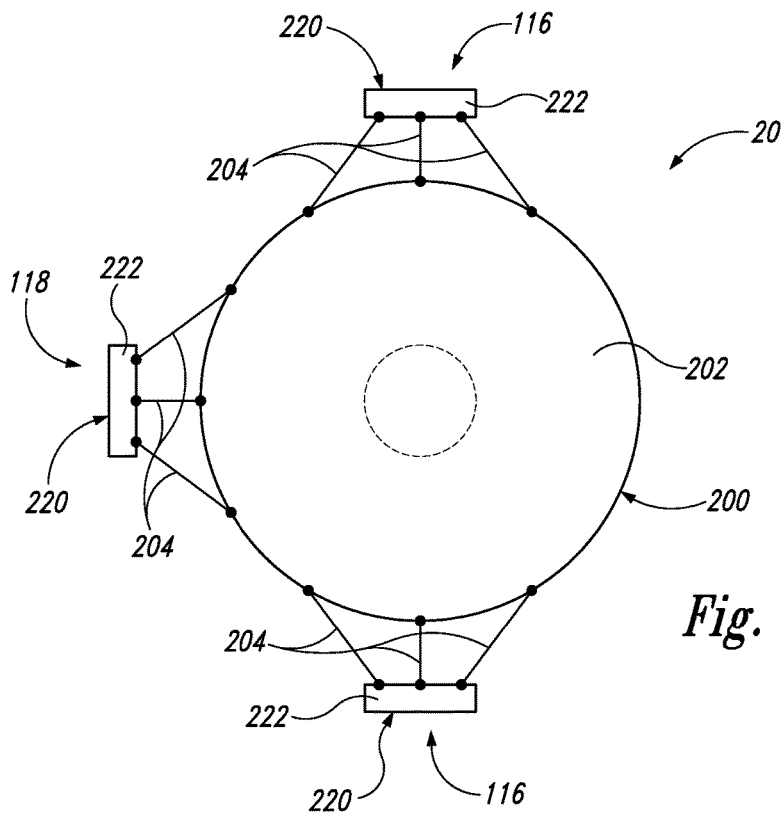
FIG. 3 is a schematic top view of an example of a chuck according to the present disclosure.
Figure 4:
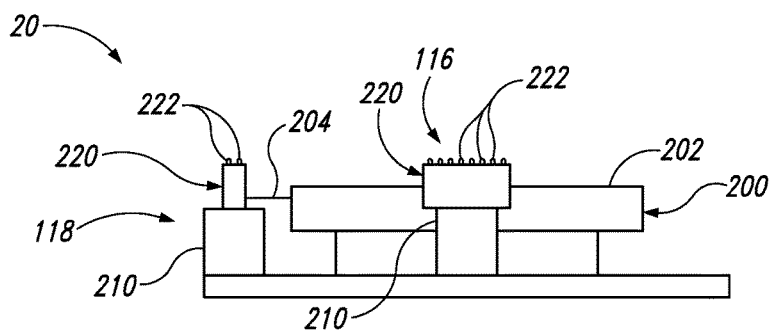
FIG. 4 is a schematic side view of the chuck of FIG. 3.

FIGS. 3-6 provide less schematic examples of a chuck 200 and/or components thereof that may be included in and/or utilized with test systems 20 according to the present disclosure, including test systems 20 of FIGS. 1-2. FIG. 3 is a schematic top view of chuck 200, while FIG. 4 is a schematic side view of chuck 200.

In FIGS. 3-4, chuck 200 includes a plurality of chuck-side contacting structures 220 that each define a respective chuck-side contacting region 222. Chuck-side contacting structures 220 may be in electrical communication with a conductive support surface 202 of chuck 200, such as via one or more electrical linkages 204 and otherwise may be electrically isolated from a remainder of chuck 200 via one or more insulators 210 (as illustrated in FIG. 4). Thus, and when a substrate 30 is located on chuck 200 and/or supported by conductive support surface 202, chuck-side contacting structures 220 may be in electrical communication with second side 44 of the DUT(s) 40 that may be present on the substrate (as illustrated in FIG. 2). As illustrated in FIGS. 3-4, chuck-side contacting structures 220 may be offset and/or spaced apart from conductive support surface 202 and/or from a portion of conductive support surface 202 that is configured to contact the substrate.

It is within the scope of the present disclosure that at least one chuck-side contacting structure 220 may be utilized independently of a remainder of the chuck-side contacting structures. As an example, one chuck-side contacting structure 220 may function as and/or may be a first electrical connection 116 that may be utilized to convey an electric current to and/or from a DUT 40 (as discussed in more detail herein with reference to FIG. 1). In addition, another chuck-side contacting structure 220 may function as and/or may be a second electrical connection 118 that may be utilized to measure and/or determine a voltage of conductive support surface 202 (as also discussed in more detail herein with reference to FIG. 1).

Additionally or alternatively, it is also within the scope of the present disclosure that at least two chuck-side contacting structures 220 may be utilized in parallel. As an example, and as illustrated in FIG. 3, chuck 200 may include two chuck-side contacting structures 220 that may function as first electrical connection 116. The use of two chuck-side contacting structures 220 for first electrical connection 116 may increase a current-carrying capacity of the first electrical connection.

FIG. 5 is a schematic top view of chuck-side contacting structure 220 of chuck 20, while FIG. 6 is a schematic side view of the chuck-side contacting structure of FIG. 5. In FIGS. 5-6, chuck-side contacting structure 220 includes a plurality of compliant members 224, such as a plurality of spring-loaded pins 226, that define chuck-side contacting region 222.

FIG. 7 is a schematic side view of examples of another test system 20 according to the present disclosure prior to contact between a probe head assembly 100 and a substrate 30 that is supported by a chuck 200. FIG. 8 is a schematic side view of the test system of FIG. 7 subsequent to contact between the probe head assembly and the substrate. FIG. 9 is a schematic electrical diagram of test system 20 of FIGS. 7-8. Chuck 200 of FIGS. 7-9 may include and/or be chuck 200 of FIGS. 3-6. In addition, test system 20 of FIGS. 7-9 may include and/or be test system 20 of FIGS. 1-2.

In FIGS. 7-8, probe head assembly 100 includes a probe head 102 that includes a probe 104. Probe head 102 is operatively attached to a first side 142 of a platen 140 that defines an open region 150 (as illustrated in FIGS. 7-8). Open region 150 extends between first side 142 and a second side 144 of platen 140. Second side 144 is generally opposed to first side 142, and probe 104 extends through the open region. In addition, a plurality of probe-side contacting structures 120 is operatively attached to second side 144 via a plurality of insulators 210 that electrically insulate the probe-side contacting structures from the platen.

As discussed, probe-side contacting structures 120 are aligned with and/or opposed to corresponding chuck-side contacting structures 220 of chuck 200. In addition, probe-side contacting structures 120 are offset from and/or spaced apart from open region 150, at least in a direction that is parallel to an electrically conductive support surface 202 of chuck 200 and/or parallel to second side 144 of platen 140.

As illustrated in FIGS. 7-9, test system 20 may include a plurality of probe-side contacting structures 120, with the plurality of probe-side contacting structures including at least a first probe-side contacting structure 162 and a second probe-side contacting structure 164. In addition, test system 20 also may include a plurality of chuck-side contacting structures 220, with the plurality of chuck-side contacting structures including at least a first chuck-side contacting structure 262 and a second chuck-side contacting structure 264. Test system 20 further may include a plurality of probes 104, with the plurality of probes including a first probe 112 and a second probe 114.

As discussed, test system 20 may be configured to form a four-point, or quasi-Kelvin, connection with a DUT 40 that is located on substrate 30. As an example, test system 20 may be configured to provide a force signal from a power supply 62 of a signal generation and analysis assembly 60 (as illustrated in FIG. 9) to DUT 40 from probe head assembly 100 via first probe-side contacting structure 162, first chuck-side contacting structure 262, and electrically conductive support surface 202. In addition, test system 20 may be configured to receive the force signal with probe head assembly 100 via first probe 112. First probe-side contacting structure 162 may receive the force signal from an electrical conduit 70, such as a transmission line 72. As illustrated, transmission line 72 is indicated at 74 as a first transmission line. First probe 112 may provide the force signal to the first transmission line. The (first) transmission line may convey the force signal between the probe head assembly and signal generation and analysis assembly 60, as discussed in more detail herein. Thus, test system 20 may be configured to define an electrical circuit 90 that includes first probe 112, DUT 40, electrically conductive support surface 202, first chuck-side contacting structure 262, and first probe-side contacting structure 162. This electrical circuit 90 that includes first probe 112 may be referred to as a first electrical circuit 90.

Test system 20 further may be configured to sense a voltage between second probe 114 and electrically conductive support surface 202. This may be accomplished via second chuck-side contacting structure 264 and second probe-side contacting structure 164. Under these conditions, both first probe 112 and second probe 114 may be in electrical contact with a single (or the same) portion of DUT 40, such as with a contact pad that is formed on DUT 40. Second probe-side contacting structure 164 and second probe 114 may be in electrical communication with the signal generation and analysis assembly via transmission lines 72. As illustrated, such transmission lines 72 are indicated at 76 as a second transmission line and at 78 as a third transmission line, respectively. Thus, test system 20 may be configured to define an electrical circuit 90 that includes second probe 114, DUT 40, electrically conductive support surface 202, second chuck-side contacting structure 264, and second probe-side contacting structure 164. This electrical circuit 90 that includes second probe 114 may be referred to as a second electrical circuit 90.

FIG. 7 illustrates that, prior to contact between probe head assembly 100 and substrate 30, probe-side contacting structures 120 and corresponding chuck-side contacting structures 220 may be spaced apart from one another and/or may not form an electrical connection therebetween. However, and as illustrated in FIG. 8, probe-side contacting structures 120 and corresponding chuck-side contacting structures 220 may be in contact with one another subsequent to contact between probe head assembly 100 and substrate 30 (or at least subsequent to the contact and during testing of DUT 40). The contact between probe-side contacting structures 120 and corresponding chuck-side contacting structures 220 may occur concurrently with and/or as a result of contact between probe head assembly 100 and substrate 30.

Additionally or alternatively, a separate contact engine 80 may be utilized to establish the contact between the probe-side contacting structures 120 and corresponding chuck-side contacting structures 220, as discussed in more detail herein.

Returning to FIG. 9, probe head assembly 100 further may include an additional probe 104, in the form of a gate biasing probe 170. Gate biasing probe 170 may be configured to selectively provide a gate biasing signal to a transistor 43 of DUT 40 to selectively transition the transistor between electrically insulating (off) and electrically conductive (on) states.

With continued reference to FIG. 9, signal generation and analysis assembly 60 is illustrated as including a load resistor 64, a voltage detector 66, and a function generator 68. However, other configurations for signal generation and analysis assembly 60 are also within the scope of the present disclosure.

Figure 10:
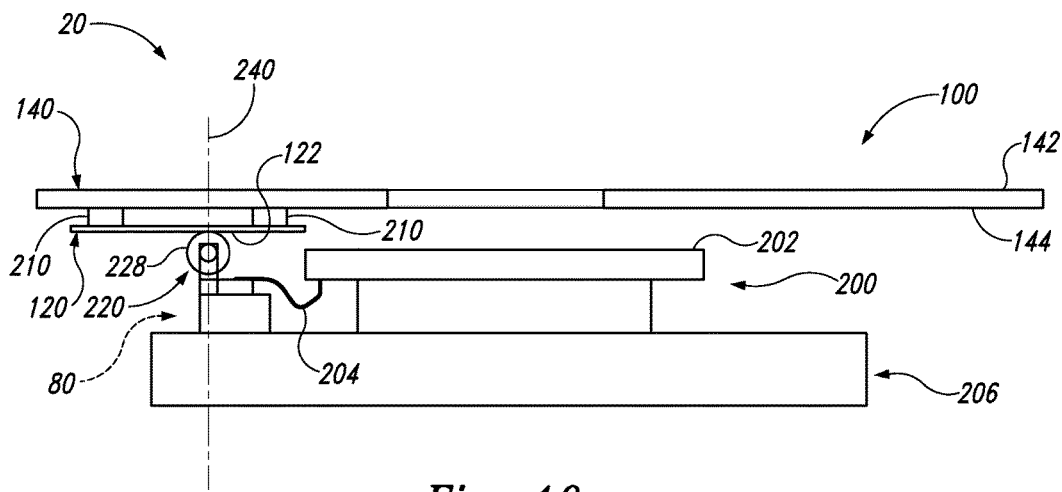
FIG. 10 is a schematic representation of an example of a test system according to the present disclosure.
Figure 11:
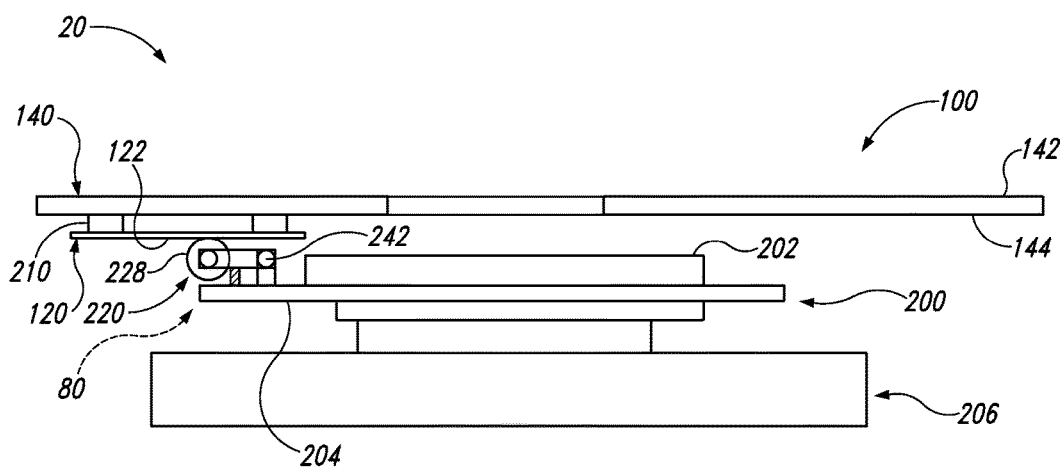
FIG. 11 is a schematic representation of an example of a test system according to the present disclosure.

FIGS. 10-11 provide schematic representations of examples of additional test systems 20 according to the present disclosure. FIGS. 10-11 illustrate that chuck-side contacting structure 220 according to the present disclosure also may include and/or be a structure, such as a biased roller assembly 228, that is configured to remain in contact with probe-side contacting structure 120 during relative motion between the chuck-side contacting structure and the probe-side contacting structure.

As illustrated in FIG. 10, biased roller assembly 228 may be a linearly acting biased roller assembly 228 that is configured to translate along an axis of translation 240, thereby permitting contact between chuck-side contacting structure 220 and probe-side contacting structure 120 over a range of distances between chuck 200 and probe head assembly 100. FIG. 10 further illustrates that chuck-side contacting structure 220 may be operatively affixed to a chuck stage 206, which is configured to translate chuck 200 relative to probe head assembly 100, and may be electrically connected to chuck 200 via one or more electrical linkages 204.

Alternatively, and as illustrated in FIG. 11, biased roller assembly 228 also may be a radially acting biased roller assembly 228 that is configured to rotate about a pivot point 242, thereby permitting contact between chuck-side contacting structure 220 and probe-side contacting structure 120 over a range of distances between chuck 200 and probe head assembly 100. FIG. 11 further illustrates that chuck-side contacting structure 220 may be operatively affixed to chuck 200 directly and/or via one or more electrical linkages 204.

Regardless of the exact configuration of test systems 20, biased roller assemblies 228 may be configured to maintain contact with probe-side contacting structure 120 over at least a desired, specified, and/or target range of distances between chuck 200 and probe head assembly 100. This may include biased roller assemblies 228 that include a contact engine 80 and/or that are configured to selectively establish and cease electrical contact with probe-side contacting structures 120, as discussed in more detail herein with reference to chuck-side contacting structures 220 of FIGS. 1-9. Additionally or alternatively, this also may include biased roller assemblies 228 that remain in electrical contact with probe-side contacting structures 120 during operation of test system 20.

Chuck-side contacting structures 220 of FIGS. 10-11 are illustrated as biased roller assemblies 228. However, it is within the scope of the present disclosure that the chuck-side contacting structures may include and/or be any suitable structure that maintains contact with probe-side contacting structures 120 over the desired range of distances between chuck 200 and probe head assembly 100. As examples, chuck-side contacting structures 220 of FIGS. 10-11 may include and/or be sliders, ball plungers, and/or spring-loaded contacts.

Selection of a specific configuration for chuck-side contacting structures 220 and/or probe-side contacting structures 120 may be based, at least in part, on a type of test that is performed by test systems 20 and/or upon a type of DUT that is tested by test systems 20. As an example, chuck-side contacting structures 220 in the form of biased roller assemblies 228 may generate less wear due to contact with probe-side contacting structures 120 when compared to chuck-side contacting structures that do not include rollers. However, biased roller assemblies 228 may generate more particulate matter than chuck-side contacting structures that do not include rollers.

As another example, a contact area between biased roller assemblies 228 and probe-side contacting structures 120 may be greater than a contact area between probe-side contacting structures 120 and chuck-side contacting structures that provide point contact with the probe-side contacting structure. As such, a current-carrying capacity of chuck-side contacting structures 220 that include biased roller assemblies 228 may be greater than a current-carrying capacity of chuck-side contacting structures that do not include roller assemblies.

FIGS. 10-11 illustrate test systems 20 that include chuck-side contacting structures 220 in the form of biased roller assemblies 228 and probe-side contacting structures 120 that include probe-side contacting regions 122 in the form of planar contacting surfaces. However, it is within the scope of the present disclosure that these structures may be reversed such that probe-side contacting structures 120 include biased roller assemblies, while chuck-side contacting structures 220 define planar contacting surfaces.

Figure 13:
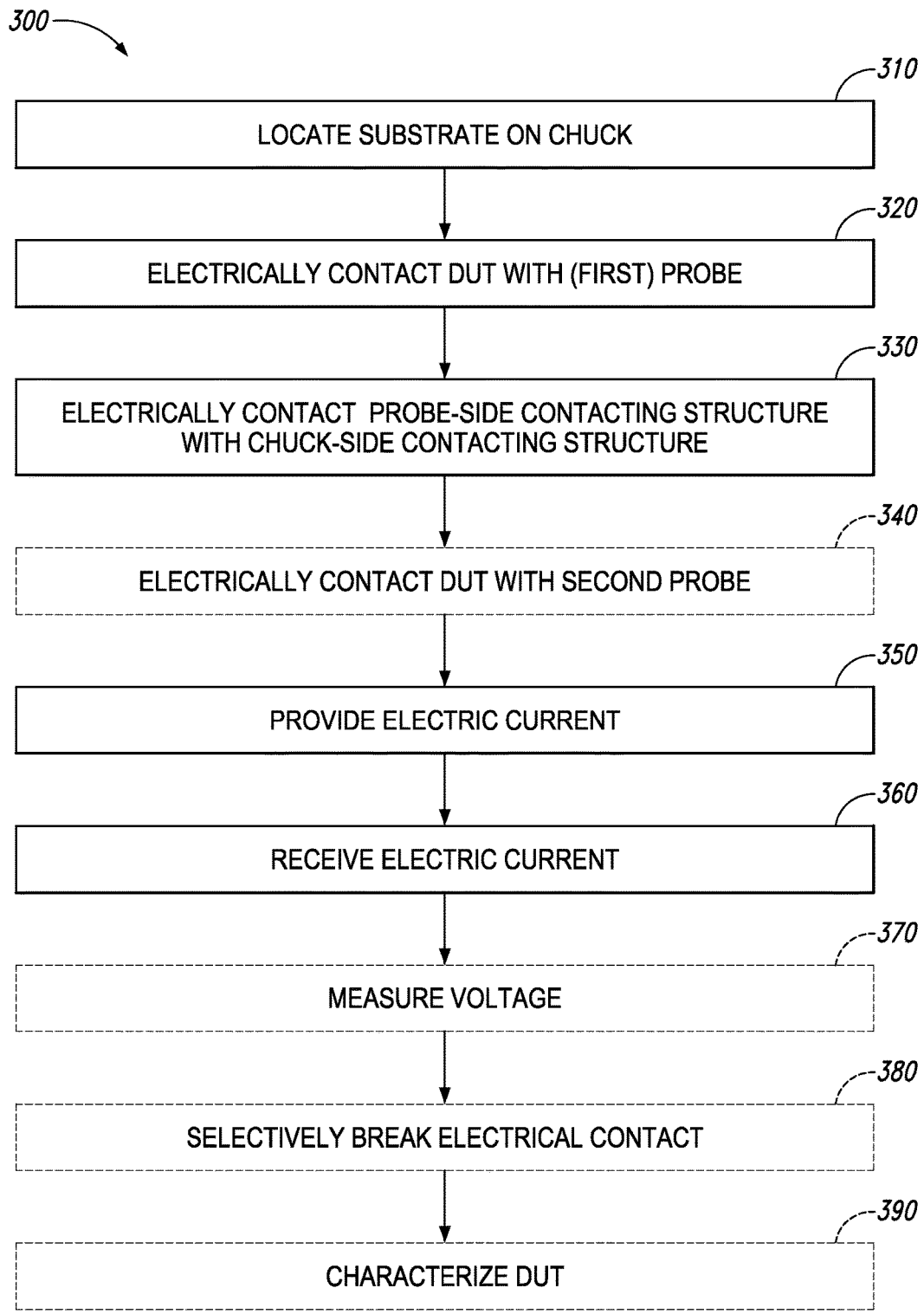
FIG. 13 is a flowchart depicting examples of methods, according to the present disclosure, of testing a device under test.

It is within the scope of the present disclosure that chuck-side contacting structures 220 that are illustrated in FIGS. 10-11 and/or discussed herein with reference to FIGS. 10-11 may be included in and/or utilized with any suitable test system 20 and/or method that is disclosed herein, including test systems 20 of FIGS. 1-9 and/or methods 300 of FIG. 13. As an example, chuck-side contacting structures 220 of FIGS. 10-11 may be utilized as part of (or to form) a four-point, or quasi-Kelvin, connection between test system 20 and a DUT. As another example, chuck-side contacting structures 220 of FIGS. 10-11 may be utilized to reduce an inductance and/or capacitance of an electrical circuit that is utilized to form the four-point connection when compared to test systems that do not include the disclosed chuck-side contacting structures.

Figure 12:
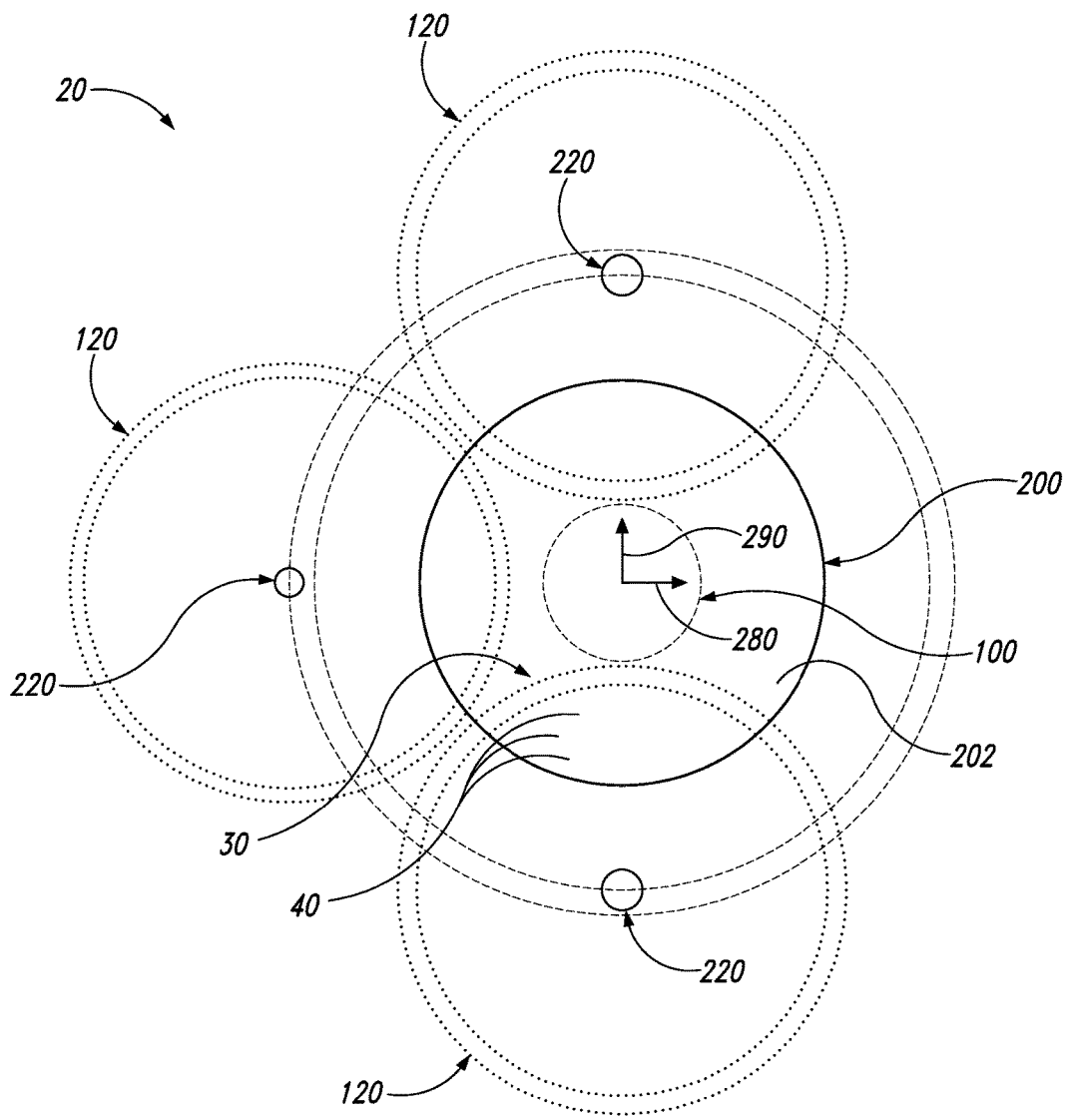
FIG. 12 is another schematic top view illustrating locations of a substrate and a chuck relative to a probe head assembly, according to the present disclosure, during testing of one or more devices under test that are present on the substrate.

FIG. 12 is a schematic top view of an example of geometries of contacting structures 120/220 and/or locations of a substrate 30 and a chuck 200 relative to a probe head 100, according to the present disclosure, during testing of one or more devices under test 40 that are present on the substrate. In FIG. 12, test system 20 includes a plurality of probe-side contacting structures 120 and a plurality of chuck-side contacting structures 220. Each of the plurality of probe-side contacting structures includes a planar contacting surface and is located to selectively form an electrical connection with a corresponding chuck-side contacting structure 220. Each of the plurality of probe-side contacting structures 120 is arranged at (substantially) a 90 degree angle relative to the other probe-side contacting structures, and each of the plurality of chuck-side contacting structures 220 is arranged at (substantially) a 90 degree angle relative to the other chuck-side contacting structures, though this is not required in all embodiments.

In FIG. 12, the upper and lower probe-side contacting structures 120 and corresponding chuck-side contacting structures 220 may carry a force signal to chuck 200, while the left-most probe-side contacting structure 120 and corresponding chuck-side contacting structure 220 may carry a sense signal. The two pairs of contacting structures that carry the force signal may be arranged at (substantially) 180 degrees relative to one another, any electrical conduits that carry the force signal may be arranged (at least substantially) along a straight line, and/or the force signal may flow in opposite directions in each of the two pairs of contacting structures. In addition, the force signal (or an electric current thereof) may be divided (at least substantially) equally between the two pairs of contacting structures. Thus, any electric field that may be generated by electric current flow through one of the two pairs of contacting structures may be opposed and/or at least partially cancelled by a corresponding electric field that may be generated by electric current flow through the other of the pairs of contacting structures. This further may decrease the inductance of test system 20.

FIG. 12 illustrates that, in order to accommodate relative motion between probe head assembly 100 and chuck 200, a size and/or extent (or at least a minimum size and/or extent) of probe-side contacting structures 120 may correspond to a relative range of motion of probe head assembly 100 and chuck 200. As an example, probe head assembly 100 and chuck 200 may define a first maximum relative range of motion in a first direction 280 that is parallel to chuck 200 (or to a conductive support surface 202 thereof). In addition, probe head assembly 100 and chuck 200 also may define a second maximum relative range of motion in a second direction 290 that is parallel to chuck 200 but perpendicular to first direction 280.

As illustrated, probe-side contacting structures 120 may define one or more planar contacting surfaces. Under these conditions, a length of the planar contacting surfaces in the first direction may be matched to the first maximum relative range of motion to within a threshold fraction of the first maximum relative range of motion. Similarly, a length of the planar contacting surfaces in the second direction may be matched to the second maximum relative range of motion to within a threshold fraction of the second maximum relative range of motion. Examples of the threshold fraction of the first and/or second maximum relative range of motion include threshold fractions of within 50%, within 40%, within 30%, within 20%, within 10%, within 5%, within 2.5%, and/or within 1% of the first and/or second maximum relative range of motion.

The first and/or second maximum relative range of motion may be selected based upon any suitable criteria. As an example, and when substrate 30 is an at least substantially circular substrate 30, the first and/or second maximum relative range of motion may correspond to, may be equal to, and/or may be matched to within a threshold fraction of a diameter of the substrate. Examples of the threshold fraction of the diameter of the substrate include threshold fractions of within 50%, within 40%, within 30%, within 20%, within 10%, within 5%, within 2.5%, and/or within 1% of the diameter of the substrate.

As discussed, FIG. 12 illustrates a test system 20 that includes a plurality of probe-side contacting structures 120 and a corresponding plurality of chuck-side contacting structures 220 that may be arranged at (substantially) 90 degrees relative to one another; however, other configurations are also within the scope of the present disclosure. As an example, probe-side contacting structures 120 and chuck-side contacting structures 220 may be arranged with a different relative orientation, such as at (substantially) 120 degrees relative to one another. As another example, test system 20 may include a single probe-side contacting structure 120 and/or a single chuck-side contacting structure 220.

FIG. 13 is a flowchart depicting examples of methods 300 according to the present disclosure of testing a DUT. The DUT may be located, formed, and/or otherwise present on a substrate that includes a plurality of DUTs. Each DUT may define a first side and a second side that is generally opposed to the first side. Methods 300 include locating a substrate on a chuck at 310 and electrically contacting a DUT with a (first) probe at 320. Methods 300 further include electrically contacting a probe-side contacting structure with a chuck-side contacting structure at 330 and may include electrically contacting the DUT with a second probe at 340. Methods 300 further include providing an electric current at 350 and receiving the electric current at 360. Methods 300 further may include measuring a voltage at 370, selectively breaking the electrical contact at 380, and/or characterizing the DUT at 390.

Locating the substrate on the chuck at 310 may include locating the substrate on an electrically conductive support surface that is defined by the chuck. Additionally or alternatively, the locating at 310 also may include electrically contacting the second side of the DUT with the electrically conductive support surface. This substrate may include a plurality of DUTs prior to singulation of the plurality of DUTs therefrom.

Electrically contacting the DUT with the (first) probe at 320 may include electrically contacting the first side of the DUT (and/or a contact pad that is present on the first side of the DUT) with the (first) probe and may be accomplished in any suitable manner. As an example, the (first) probe may form a portion of a probe head assembly, and the electrically contacting may include establishing electrical communication between the DUT and the probe head assembly via the (first) probe. As another example, the electrically contacting at 320 may include moving the chuck and the probe head assembly relative to one another, such as by moving the chuck and/or by moving the probe head assembly. It is within the scope of the present disclosure that this moving may produce the electrically contacting at 320, the electrically contacting at 330, and/or the electrically contacting at 340.

Electrically contacting the probe-side contacting structure with the chuck-side contacting structure at 330 may include establishing electrical communication between the probe-side contacting structure and the chuck-side contacting structure. For example, the electrically contacting at 330 may include establishing electrical communication by moving and/or translating the probe-side contacting structure and the chuck-side contacting structure relative to one another, such as by moving and/or translating the probe-side contacting structure, the chuck-side contacting structure, or both the probe-side contacting structure and the chuck-side contacting structure.

The chuck-side contacting structure may be in electrical communication with the electrically conductive support surface. Thus, the electrically contacting at 330 also may include establishing electrical communication between the probe-side contacting structure and the electrically conductive support surface and/or establishing electrical communication between the probe-side contacting structure and the second side of the DUT via the electrically conductive support surface.

The moving and/or translating the probe-side contacting structure and the chuck-side contacting structure relative to one another may be accomplished in any suitable manner. As an example, the electrically contacting at 330 may be accomplished via the electrically contacting at 320 and/or via the moving and/or translating the chuck and the probe head assembly relative to one another that may be performed during the electrically contacting at 320. As another example, the moving and/or translating the probe-side contacting structure and the chuck-side contacting structure relative to one another may be independent from the electrically contacting at 320, such as via a separate and/or dedicated contact engine that is associated with the probe-side contacting structure and/or with the chuck-side contacting structure. Under these conditions, the electrically contacting at 330 may be performed concurrently with the electrically contacting at 320, prior to the electrically contacting at 320, and/or subsequent to the electrically contacting at 320.

It is within the scope of the present disclosure that the electrically contacting at 330 also may include translating a probe-side contacting structure and a chuck-side contacting structure relative to one another while maintaining electrical contact therebetween. As an example, the electrically contacting at 330 may include translating a biased roller assembly along an axis of translation and/or rotating the biased roller assembly about a pivot point while maintaining electrical contact between the biased roller assembly and a respective planar contacting surface.

Electrically contacting the DUT with the second probe at 340 may include electrically contacting the first side of the DUT with the second probe of the probe head assembly and may be accomplished in any suitable manner. As an example, the electrically contacting at 340 may include electrically contacting the second probe with the contact pad that also contacts the first probe during the contacting at 320.

When methods 300 include the electrically contacting at 340, the chuck-side contacting structure may be a first chuck-side contacting structure, the probe-side contacting structure may be a first probe-side contacting structure, and methods 300 further may include electrically contacting a second probe-side contacting structure with a second chuck-side contacting structure. Similar to the first chuck-side contacting structure, the second chuck-side contacting structure may be in electrical communication with the electrically conductive support surface both prior to and subsequent to the electrically contacting at 340. Such a configuration may permit the first chuck-side contacting structure and the first probe-side contacting structure together to be utilized to carry a force current, while the second chuck-side contacting structure and the second probe-side contacting structure together may be utilized to perform a sense measurement. This may permit the test system to perform a Kelvin, or quasi-Kelvin, measurement of the DUT, as discussed in more detail herein.

Providing the electric current at 350 may include providing any suitable voltage and/or current to the DUT in any suitable manner. As an example, the providing at 350 may include providing the electric voltage and/or current to the (first) probe and/or providing the electric voltage and/or current to the DUT via the (first) probe. As another example, the providing at 350 also may include providing the electric voltage and/or current to the (first) probe-side contacting structure and/or providing the electric voltage and/or current to the DUT via the (first) probe-side contacting structure, the (first) chuck-side contacting structure, and the conductive support surface.

The providing at 350 may include providing any suitable magnitude of electric current to the DUT. As examples, the providing at 350 may include providing at least 1 amp (A), at least 5 A, at least 10 A, at least 20 A, at least 30 A, at least 50 A, at least 75 A, at least 100 A, at least 150 A, at least 200 A, at least 300 A, at least 400 A, at least 500 A, at least 600 A, at least 700 A, at least 800 A, at least 900 A, or at least 1000 A of electric current to the DUT.

The providing at 350 may include providing a pulsed electric voltage and/or current of any suitable pulse width. As examples, the pulse width may be less than 10 milliseconds (ms), less than 7.5 ms, less than 5 ms, less than 2.5 ms, less than 2 ms, less than 1 ms, less than 750 microseconds, less than 500 microseconds, less than 250 microseconds, less than 100 microseconds, less than 1 millisecond, less than 750 nanoseconds (ns), less than 500 ns, less than 250 ns, less than 100 ns, or less than 50 ns.

When the providing at 350 includes providing the pulsed electric voltage and/or current, the pulsed electric voltage and/or current may be provided with any suitable rise time. As examples, the rise time may be less than 1000 nanoseconds (ns), less than 750 ns, less than 500 ns, less than 250 ns, less than 200 ns, less than 100 ns, less than 75 ns, less than 50 ns, less than 40 ns, less than 30 ns, less than 20 ns, less than 15 ns, less than 10 ns, less than 5 ns, or less than 1 ns.

When the providing at 350 includes providing the pulsed electric voltage and/or current, the pulsed electric voltage and/or current also may be provided with any suitable duty cycle. As examples, the pulsed electric voltage and/or current may be provided with a duty cycle of less than 20%, less than 15%, less than 10%, less than 7.5%, less than 5%, less than 2.5%, less than 1%, less than 0.75%, less than 0.5%, or less than 0.1%.

Receiving the electric current at 360 may include receiving any suitable voltage and/or current from the DUT in any suitable manner. As an example, and when the providing at 350 includes providing the electric voltage and/or current to the (first) probe, the receiving at 360 may include flowing the current from the (first) probe to the DUT, from the DUT to the electrically conductive support surface, from the electrically conductive support surface to the (first) chuck-side contacting structure, and from the (first) chuck-side contacting structure to the (first) probe-side contacting structure. As another example, and when the providing at 350 includes providing the electric voltage and/or current to the (first) probe-side contacting structure, the receiving at 360 may include flowing the electric current from the (first) probe-side contacting structure to the (first) chuck-side contacting structure, from the (first) chuck-side contacting structure to the electrically conductive support surface, from the electrically conductive support surface to the DUT, and from the DUT to the (first) probe.

When methods 300 include the electrically contacting at 340, methods 300 further may include the measuring the voltage at 370. The measuring the voltage at 370 may include measuring a voltage between the second probe and the electrically conductive support surface via the second chuck-side contacting structure and the second probe-side contacting structure. This may include measuring a voltage drop across the DUT that is produced as a result of the providing at 350, thereby permitting a four-point, Kelvin, or Quasi-Kelvin measurement of the voltage drop across the DUT.

When methods 300 include the electrically contacting at 340, methods 300 further may include the selectively breaking (and/or otherwise interrupting or disconnecting) the electrical contact at 380. The selectively breaking at 380 may include selectively breaking the electrical contact between the first probe-side contacting structure and the first chuck-side contacting structure, and it is within the scope of the present disclosure that methods 300 may include maintaining the electrical contact between the second probe-side contacting structure and the second chuck-side contacting structure during the selectively breaking at 380.

As discussed, the first probe-side contacting structure and the first chuck-side contacting structure may include a separate and/or dedicated contact engine that may be utilized to permit the breaking at 380 while maintaining the electrical contacting between the second probe-side contacting structure and the second chuck-side contacting structure. Such a configuration (i.e., a configuration that permits and/or facilitates the breaking at 380) may reduce the capacitive load on the DUT subsequent to the breaking at 380, thereby permitting more accurate low-current measurements of DUT performance to be made by conducting a smaller electric current via an electric circuit that includes the second probe, the DUT, the electrically conductive support surface, the second chuck-side contacting structure, and the second probe-side contacting structure. This may include performing off-current leakage measurements of the DUT.

Characterizing the DUT at 390 may include characterizing any suitable property of the DUT. As an example, the characterizing at 390 may include characterizing a switching performance of the DUT. As another example, the characterizing at 390 also may include characterizing a power consumption of the DUT. It is within the scope of the present disclosure that the characterizing at 390 may be based, at least in part, on the providing at 350, the receiving at 360, and/or the measuring at 370, when performed.

As discussed herein, the systems and methods according to the present disclosure may reduce the inductance and/or capacitance of the measurement circuit that is utilized to characterize the DUT when compared to conventional test systems, which may not include the probe-side contacting structures and/or the chuck-side contacting structures disclosed herein. Thus, the systems and methods according to the present disclosure may permit and/or facilitate characterization of faster rise times, may permit and/or facilitate observation of faster voltage and/or current transients, and/or may permit and/or facilitate higher frequency measurements than may be performed utilizing conventional test systems.

In the present disclosure, several of the examples have been discussed and/or presented in the context of flow diagrams, or flow charts, in which the methods are shown and described as a series of blocks, or steps. Unless specifically set forth in the accompanying description, it is within the scope of the present disclosure that the order of the blocks may vary from the illustrated order in the flow diagram, including with two or more of the blocks (or steps) occurring in a different order and/or concurrently. It is also within the scope of the present disclosure that the blocks, or steps, may be implemented as logic, which also may be described as implementing the blocks, or steps, as logics. In some applications, the blocks, or steps, may represent expressions and/or actions to be performed by functionally equivalent circuits or other logic devices. The illustrated blocks may, but are not required to, represent executable instructions that cause a computer, a processor, and/or another logic device to respond, to perform an action, to change states, to generate an output or display, and/or to make decisions.

As used herein, the term "and/or" placed between a first entity and a second entity means one of (1) the first entity, (2) the second entity, and (3) the first entity and the second entity. Multiple entities listed with "and/or" should be construed in the same manner, i.e., "one or more" of the entities so conjoined. Other entities may optionally be present other than the entities specifically identified by the "and/or" clause, whether related or unrelated to those entities specifically identified. Thus, as a non-limiting example, a reference to "A and/or B," when used in conjunction with open-ended language such as "comprising" may refer, in one embodiment, to A only (optionally including entities other than B); in another embodiment, to B only (optionally including entities other than A); and in yet another embodiment, to both A and B (optionally including other entities). These entities may refer to elements, actions, structures, steps, operations, values, and the like.

As used herein, the phrase "at least one," in reference to a list of one or more entities should be understood to mean at least one entity selected from any one or more of the entities in the list of entities, but not necessarily including at least one of each and every entity specifically listed within the list of entities and not excluding any combinations of entities in the list of entities. This definition also allows that entities may optionally be present other than the entities specifically identified within the list of entities to which the phrase "at least one" refers, whether related or unrelated to those entities specifically identified. Thus, as a non-limiting example, "at least one of A and B" (or, equivalently, "at least one of A or B," or, equivalently "at least one of A and/or B") may refer, in one embodiment, to at least one, optionally including more than one, A, with no B present (and optionally including entities other than B); in another embodiment, to at least one, optionally including more than one, B, with no A present (and optionally including entities other than A); and in yet another embodiment, to at least one, optionally including more than one, A, and at least one, optionally including more than one, B (and optionally including other entities). In other words, the phrases "at least one," "one or more," and "and/or" are open-ended expressions that are both conjunctive and disjunctive in operation. For example, each of the expressions "at least one of A, B and C," "at least one of A, B, or C," "one or more of A, B, and C," "one or more of A, B, or C" and "A, B, and/or C" may mean A alone, B alone, C alone, A and B together, A and C together, B and C together, A, B and C together, and optionally any of the above in combination with at least one other entity.

In the event that any patents, patent applications, or other references are incorporated by reference herein and (1) define a term in a manner that is inconsistent with and/or (2) are otherwise inconsistent with, either the non-incorporated portion of the present disclosure or any of the other incorporated references, the non-incorporated portion of the present disclosure shall control, and the term or incorporated disclosure therein shall only control with respect to the reference in which the term is defined and/or the incorporated disclosure was present originally.

As used herein the terms "adapted" and "configured" mean that the element, component, or other subject matter is designed and/or intended to perform a given function. Thus, the use of the terms "adapted" and "configured" should not be construed to mean that a given element, component, or other subject matter is simply "capable of" performing a given function but that the element, component, and/or other subject matter is specifically selected, created, implemented, utilized, programmed, and/or designed for the purpose of performing the function. It is also within the scope of the present disclosure that elements, components, and/or other recited subject matter that is recited as being adapted to perform a particular function may additionally or alternatively be described as being configured to perform that function, and vice versa.

As used herein, the phrase, "for example," the phrase, "as an example," and/or simply the term "example," when used with reference to one or more components, features, details, structures, embodiments, and/or methods according to the present disclosure, are intended to convey that the described component, feature, detail, structure, embodiment, and/or method is an illustrative, non-exclusive example of components, features, details, structures, embodiments, and/or methods according to the present disclosure. Thus, the described component, feature, detail, structure, embodiment, and/or method is not intended to be limiting, required, or exclusive/exhaustive; and other components, features, details, structures, embodiments, and/or methods, including structurally and/or functionally similar and/or equivalent components, features, details, structures, embodiments, and/or methods, are also within the scope of the present disclosure.

Examples of systems and methods according to the present disclosure are presented in the following enumerated paragraphs. It is within the scope of the present disclosure that an individual step of a method recited herein, including in the following enumerated paragraphs, may additionally or alternatively be referred to as a "step for" performing the recited action.

A1. A test system for electrically testing a device under test (DUT) that is formed on a substrate that includes a plurality of DUTs, wherein the DUT defines a first side and a second side that is opposed to the first side, the test system comprising:

a probe head assembly that includes a probe that is configured to electrically contact the first side of the DUT;

a probe-side contacting structure that includes a probe-side contacting region;

a chuck that includes an electrically conductive support surface that is configured to support the substrate and to electrically contact the second side of the DUT, wherein the probe head assembly and the chuck are configured to selectively translate relative to one another to selectively establish electrical contact between the probe and the DUT; and a chuck-side contacting structure that includes a chuck-side contacting region, wherein the chuck-side contacting structure is in electrical communication with the electrically conductive support surface, and further wherein the chuck-side contacting structure and the probe-side contacting structure are opposed to one another and are configured to selectively establish electrical communication between the chuck-side contacting region and the probe-side contacting region.

A2. The test system of paragraph A1, wherein the test system is configured to convey a test signal between the probe and the probe-side contacting structure via the DUT, the electrically conductive support surface, and the chuck-side contacting structure.

A3. The test system of any of paragraphs A1-A2, wherein one of the probe-side contacting region and the chuck-side contacting region defines a planar contacting surface, and further wherein the other of the probe-side-contacting region and the chuck-side contacting region is defined by a compliant conductive member, and optionally by a plurality of compliant conductive members.

A4. The test system of paragraph A3, wherein the compliant conductive member, and optionally the plurality of compliant conductive members, includes at least one of a flexible conductive member, a spring, a ball plunger, a conductive member that is supported by a compliant material, a biased roller assembly, and a spring-loaded pin.

A5. The test system of any of paragraphs A3-A4, wherein the chuck and the probe head assembly define a first maximum relative range of motion in a first direction that is parallel to the electrically conductive support surface and a second maximum relative range of motion in a second direction that is parallel to the electrically conductive support surface and perpendicular to the first direction, wherein a length of the planar contacting surface in the first direction is matched to the first maximum relative range of motion to within a first threshold fraction of the first maximum relative range of motion, and further wherein a length of the planar contacting surface in the second direction is matched to the second maximum relative range of motion to within a second threshold fraction of the second maximum relative range of motion.

A6. The test system of paragraph A5, wherein the first threshold fraction is within 50%, within 40%, within 30%, within 20%, within 10%, within 5%, within 2.5%, or within 1% of the first maximum relative range of motion.

A7. The test system of any of paragraphs A5-A6, wherein the second threshold fraction is within 50%, within 40%, within 30%, within 20%, within 10%, within 5%, within 2.5%, or within 1% of the second maximum relative range of motion.

A8. The test system of any of paragraphs A1-A7, wherein the probe-side contacting structure at least one of (i) is operatively attached to the probe head assembly and (ii) forms a portion of the probe head assembly.

A9. The test system of any of paragraphs A1-A8, wherein the probe-side contacting region at least one of (i) faces toward the chuck-side contacting region, (ii) faces toward the electrically conductive support surface of the chuck, (iii) faces in an opposed direction from the electrically conductive support surface of the chuck, (iv) faces toward DUT 40, and (v) faces in the same direction as the probe.

A10. The test system of any of paragraphs A1-A9, wherein the chuck-side contacting structure at least one of (i) is operatively attached to the chuck and (ii) forms a portion of the chuck.

A11. The test system of any of paragraphs A1-A10, wherein the chuck-side contacting region at least one of (i) faces toward the probe-side contacting region, (ii) faces in the same direction as the electrically conductive support surface, (iii) faces in an opposed direction from the probe, and (iv) faces toward the probe.

A12. The test system of any of paragraphs A1-A11, wherein the probe-side contacting region includes a/the planar contacting surface.

A13. The test system of paragraph A12, wherein the substrate defines a first substrate surface that faces toward the probe head assembly and defines a first substrate surface area, wherein the planar contacting surface defines a planar contacting surface area, and further wherein the planar contacting surface area is matched to the first substrate surface area to within a threshold fraction of the first substrate surface area.

A14. The test system of paragraph A13, wherein the threshold fraction is within 50%, within 40%, within 30%, within 20%, within 10%, within 5%, within 2.5%, or within 1% of the first substrate surface area.

A15. The test system of any of paragraphs A1-A14, wherein the probe head assembly includes a probe head that includes the probe and a platen that defines a first side and a second side that is opposed to the first side, wherein the probe head is operatively attached to the first side of the platen, wherein the platen defines an open region that extends between the first side of the platen and the second side of the platen, wherein the probe extends through the open region, and further wherein the probe-side contacting structure at least one of (i) is operatively attached to the second side of the platen and (ii) forms a portion of the second side of the platen.

A16. The test system of paragraph A15, wherein the probe-side contacting region is offset from the open region in a direction that is parallel to the electrically conductive support surface.

A17. The test system of any of paragraphs A1-A16, wherein the chuck-side contacting structure includes a/the plurality of compliant conductive members, and optionally wherein the plurality of compliant conductive members includes a plurality of spring-loaded pins.

A18. The test system of any of paragraphs A1-A17, wherein the chuck-side contacting structure is offset from the electrically conductive support surface in a/the direction that is parallel to the electrically conductive support surface.

A19. The test system of any of paragraphs A1-A18, wherein the probe is a first probe and the test system further includes a second probe, wherein the probe-side contacting structure is a first probe-side contacting structure that defines a first probe-side contacting region and the test system further includes a second probe-side contacting structure that defines a second probe-side contacting region, wherein the chuck-side contacting structure is a first chuck-side contacting structure that defines a first chuck-side contacting region and the test system further includes a second chuck-side contacting structure that defines a second chuck-side contacting region.

A20. The test system of paragraph A19, wherein the test system is configured to establish a quasi-Kelvin connection with the DUT during electrical testing of the DUT.

A21. The test system of any of paragraphs A19-A20, wherein the test system is configured to provide a force signal to the DUT via the first probe-side contacting structure, the first chuck-side contacting structure, and the electrically conductive support surface and to receive the force signal from the DUT via the first probe.

A22. The test system of any of paragraphs A19-A21, wherein the test system is configured to sense a voltage between the second probe and the electrically conductive support surface via the second chuck-side contacting structure and the second probe-side contacting structure.

A23. The test system of any of paragraphs A1-A22, wherein the test system includes the substrate, wherein the substrate is located on the electrically conductive support surface, wherein a/the first probe is in electrical contact with a contact pad of the DUT, and further wherein a/the second probe is in electrical contact with the contact pad of the DUT.

A24. The test system of paragraph A23, when dependent from paragraph A19, wherein the test system defines a first electrical circuit that includes the first probe, the DUT, the electrically conductive support surface, the first chuck-side contacting structure, and the first probe-side contacting structure.

A25. The test system of any of paragraphs A23-A24, when dependent from paragraph A19, wherein the test system defines a second electrical circuit that includes the second probe, the DUT, the electrically conductive support surface, the second chuck-side contacting structure, and the second probe-side contacting structure.

A26. The test system of any of paragraphs A1-A25, wherein the DUT includes at least one of a power device, a diode, a metal oxide semiconductor field effect transistor, an insulated gate bipolar transistor, and a bipolar junction transistor.

A27. The test system of any of paragraphs A1-A26, wherein the DUT is designed to operate at an operating current of at least 1 amp (A), at least 5 A, at least 10 A, at least 20 A, at least 30 A, at least 50 A, at least 75 A, at least 100 A, at least 150 A, at least 200 A, at least 300 A, at least 400 A, at least 500 A, at least 600 A, at least 700 A, at least 800 A, at least 900 A, or at least 1000 A.

A28. The test system of any of paragraphs A1-A27, wherein the test system further includes a transmission line that extends between a signal generation and analysis assembly and the probe head.

A29. The test system of paragraph A28, wherein the signal generation and analysis assembly is configured to provide an electric current to one of the probe and the probe-side contacting structure via the transmission line and to receive the electric current from the other of the probe and the probe-side contacting structure via the transmission line.

A30. The test system of any of paragraphs A28-A29, wherein the test system includes the signal generation and analysis assembly.

A31. The test system of any of paragraphs A28-A30, wherein the transmission line includes a coaxial transmission line that includes an inner conductor and an outer conductor.

A32. The test system of any of paragraphs A1-A31, wherein the test system is configured such that the probe-side contacting region and the chuck-side contacting region electrically contact one another when electrical contact is selectively established between the probe and the DUT.

A33. The test system of any of paragraphs A1-A32, wherein the test system further includes a contacting engine that is configured to selectively establish the electrical communication between the chuck-side contacting region and the probe-side contacting region.

A34. The test system of paragraph A33, wherein the contact engine includes at least one of a solenoid, a piezo-electric device, a rotating mechanism, a ball screw, a rack and pinion assembly, an electromechanical contact engine, a pneumatic contact engine, and a hydraulic contact engine.

A35. The test system of any of paragraphs A33-A34, wherein the contact engine is configured to establish the electrical communication between the chuck-side contacting region and the probe-side contact region independent from contact between the probe and the DUT.

B1. A method of electrically testing a device under test (DUT) that is formed on a substrate that includes a plurality of DUTs, wherein the DUT defines a first side and a second side that is opposed to the first side, the method comprising:

locating the substrate on an electrically conductive support surface that is defined by a chuck, wherein the locating includes electrically contacting the second side of the DUT with the electrically conductive support surface;

electrically contacting the first side of the DUT with a probe of a probe head assembly;

electrically contacting a probe-side contacting structure with a chuck-side contacting structure, wherein the chuck-side contacting structure is in electrical communication with the electrically conductive support surface;

providing an electric current to one of the probe and the probe-side contacting structure; and receiving the electric current from the other of the probe and the probe-side contacting structure.

B2. The method of paragraph B1, wherein the providing includes providing the electric current to the probe-side contacting structure, and further wherein the receiving includes flowing the electric current from the probe-side contacting structure to the chuck-side contacting structure, from the chuck-side contacting structure to the electrically conductive support surface, from the electrically conductive support surface to the DUT, and from the DUT to the probe.

B3. The method of paragraph B1, wherein the providing includes providing the electric current to the probe, and further wherein the receiving includes flowing the electric current from the probe to the DUT, from the DUT to the electrically conductive support surface, from the electrically conductive support surface to the chuck-side contacting structure, and from the chuck-side contacting structure to the probe-side contacting structure.

B4. The method of any of paragraphs B1-B3, wherein the method includes moving the chuck and the probe head assembly relative to one another to produce the electrically contacting the first side of the DUT with the probe and to produce the electrically contacting the probe-side contacting structure with the chuck-side contacting structure.

B5. The method of any of paragraphs B1-B4, wherein the method includes moving the chuck and the probe head assembly relative to one another to produce the electrically contacting the first side of the DUT with the probe, and further wherein the method includes moving the probe-side contacting structure and the chuck-side contacting structure relative to one another to produce the electrically contacting the probe-side contacting structure with the chuck-side contacting structure.

B6. The method of paragraph B5, wherein the moving the probe-side contacting structure and the chuck-side contacting structure relative to one another is at least one of:
(i) independent from the moving the chuck and the probe head assembly relative to one another;
(ii) performed prior to the moving the chuck and the probe head assembly relative to one another; and
(iii) performed subsequent to the moving the chuck and the probe head assembly relative to one another.

B7. The method of any of paragraphs B1-B6, wherein the probe is a first probe and the method further includes electrically contacting the first side of the DUT with a second probe of the probe head assembly, wherein the probe-side contacting structure is a first probe-side contacting structure, wherein the chuck-side contacting structure is a first chuck-side contacting structure, and further wherein the method includes electrically contacting a second probe-side contacting structure with a second chuck-side contacting structure that is in electrical communication with the electrically conductive support surface.

B8. The method of paragraph B7, wherein the method further includes measuring a voltage between the second probe and the electrically conductive support surface via the second chuck-side contacting structure and the second probe-side contacting structure.

B9. The method of any of paragraphs B7-B8, wherein the method further includes selectively breaking electrical contact between the first probe-side contacting structure and the first chuck-side contacting structure while maintaining electrical contact between the second probe-side contacting structure and the second chuck-side contacting structure.

B10. The method of any of paragraphs B1-B9, wherein the providing the electric current includes providing an electric current of at least 1 amp (A), at least 5 A, at least 10 A, at least 20 A, at least 30 A, at least 50 A, at least 75 A, at least 100 A, at least 150 A, at least 200 A, at least 300 A, at least 400 A, at least 500 A, at least 600 A, at least 700 A, at least 800 A, at least 900 A, or at least 1000 A.

B11. The method of any of paragraphs B1-B10, wherein the providing the electric current includes providing a pulsed electric current with a pulse width of less than 10 milliseconds (ms), less than 7.5 ms, less than 5 ms, less than 2.5 ms, less than 2 ms, less than 1 ms, less than 750 microseconds, less than 500 microseconds, less than 250 microseconds, less than 100 microseconds, less than 1 microsecond, less than 750 nanoseconds (ns), less than 500 ns, less than 250 ns, less than 100 ns, or less than 50 ns.

B12. The method of paragraph B11, wherein the providing the pulsed electric current includes providing the pulsed electric current with a rise time of less than 1000 nanoseconds (ns), less than 750 ns, less than 500 ns, less than 250 ns, less than 200 ns, less than 100 ns, less than 75 ns, less than 50 ns, less than 40 ns, less than 30 ns, less than 20 ns, less than 15 ns, less than 10 ns, less than 5 ns, or less than 1 ns.

B13. The method of any of paragraphs B11-B12, wherein the providing the pulsed electric current includes providing the pulsed electric current with a duty cycle of less than 20%, less than 15%, less than 10%, less than 7.5%, less than 5%, less than 2.5%, less than 1%, less than 0.75%, less than 0.5%, or less than 0.1%.

B14. The method of any of paragraphs B1-B13, wherein the method further includes characterizing the DUT, wherein the characterizing includes characterizing at least one of a switching performance of the DUT and a power consumption of the DUT.

INDUSTRIAL APPLICABILITY

The systems and methods disclosed herein are applicable to the electronic device manufacturing and/or test industries.

It is believed that the disclosure set forth above encompasses multiple distinct inventions with independent utility. While each of these inventions has been disclosed in its preferred form, the specific embodiments thereof as disclosed and illustrated herein are not to be considered in a limiting sense as numerous variations are possible. The subject matter of the inventions includes all novel and non-obvious combinations and subcombinations of the various elements, features, functions and/or properties disclosed herein. Similarly, where the claims recite "a" or "a first" element or the equivalent thereof, such claims should be understood to include incorporation of one or more such elements, neither requiring nor excluding two or more such elements.

It is believed that the following claims particularly point out certain combinations and subcombinations that are directed to one of the disclosed inventions and are novel and non-obvious. Inventions embodied in other combinations and subcombinations of features, functions, elements and/or properties may be claimed through amendment of the present claims or presentation of new claims in this or a related application. Such amended or new claims, whether they are directed to a different invention or directed to the same invention, whether different, broader, narrower, or equal in scope to the original claims, are also regarded as included within the subject matter of the inventions of the present disclosure.

The invention claimed is:

1. A test system for electrically testing a device under test (DUT) that is formed on a substrate that includes a plurality of DUTs, wherein the DUT defines a first side and a second side that is opposed to the first side, the test system comprising:
a probe head assembly that includes a first probe and a second probe that are configured to electrically contact a single contact pad on the first side of the DUT;
a pair of first probe-side contacting structures that defines a pair of first probe-side contacting regions;
a second probe-side contacting structure that defines a second probe-side contacting region;
a chuck that includes an electrically conductive support surface that is configured to directly support the substrate and to directly electrically contact the second side of the DUT, wherein the probe head assembly and the chuck are configured to selectively translate relative to one another to selectively establish electrical contact between the probe and the DUT;
a pair of first chuck-side contacting structures that defines a pair of first chuck-side contacting regions, wherein the pair of first chuck-side contacting structures is in electrical communication with the electrically conductive support surface, wherein the pair of first chuck-side contacting structures and the pair of first probe-side contacting structures are opposed to one another and are configured to selectively establish electrical communication between the pair of first chuck-side contacting regions and the pair of first probe-side contacting regions; and further wherein the pair of first chuck-side contacting structures is arranged at 180 degrees relative to one another, with the chuck extending therebetween; and a second chuck-side contacting structure that defines a second chuck-side contacting region, wherein the second chuck-side contacting structure is in electrical communication with the electrically conductive support surface, wherein the second chuck-side contacting structure and the second probe-side contacting structure are opposed to one another and are configured to selectively establish electrical communication between the second chuck-side contacting region and the second probe-side contacting region;

wherein the test system is configured to provide a force signal to the DUT via the pair of first probe-side contacting structures, the pair of first chuck-side contacting structures, and the electrically conductive support surface and to receive the force signal from the DUT via the first probe;

wherein the test system is configured to sense a voltage between the second probe and the electrically conductive support surface via the second chuck-side contacting structure and the second probe-side contacting structure; and wherein:
(i) the probe head assembly and the chuck define a first maximum relative range of motion in a first direction that is parallel to the electrically conductive support surface of the chuck and a second maximum relative range of motion in a second direction that is parallel to the electrically conductive support surface of the chuck and perpendicular to the first direction;
(ii) the first maximum relative range of motion is matched to within 25% of an outside diameter of the substrate, and the second maximum relative range of motion is matched to within 25% of a diameter of the substrate; and
(iii) the second probe-side contacting region includes a planar contacting surface that defines a first length in the first direction and a second length in the second direction, wherein the first length is matched to within 25% of the first maximum relative range of motion, and further wherein the second length is matched to within 25% of the second maximum relative range of motion.

2. The test system of claim 1, wherein the second chuck-side contacting region is defined by a compliant conductive member.

3. The test system of claim 2, wherein the compliant conductive member includes at least one of a flexible conductive member, a spring, a ball plunger, a conductive member that is supported by a compliant material, a biased roller assembly, and a spring-loaded pin.

4. The test system of claim 1, wherein:
(i) each of the pair of first probe-side contacting regions faces toward a corresponding one of the pair of first chuck-side contacting regions; and
(ii) the second probe-side contacting region faces toward the second chuck-side contacting region.

5. The test system of claim 1, wherein the second probe-side contacting region includes a planar contacting surface, wherein the substrate defines a first substrate surface that faces toward the probe head assembly and defines a first substrate surface area, wherein the planar contacting surface defines a planar contacting surface area, and further wherein the planar contacting surface area is matched to the first substrate surface area to within 25% of the first substrate surface area.

6. The test system of claim 1, wherein the probe head assembly includes a probe head that includes the first probe, the second probe, and a platen that defines a first side and a second side that is opposed to the first side, wherein the probe head is operatively attached to the first side of the platen, wherein the platen defines an open region that extends between the first side of the platen and the second side of the platen, wherein the first probe and the second probe extend through the open region, and further wherein the pair of first probe-side contacting structures and the second probe-side contacting structure at least one of (i) are operatively attached to the second side of the platen and (ii) form a portion of the second side of the platen.

7. The test system of claim 6, wherein the pair of first probe-side contacting regions and the second probe-side contacting region are offset from the open region in a direction that is parallel to the electrically conductive support surface.

8. The test system of claim 1, wherein the test system is configured to establish a quasi-Kelvin connection with the DUT during electrical testing of the DUT.

9. The test system of claim 1, wherein the test system further includes a transmission line that extends between a signal generation and analysis assembly and the probe head, wherein the signal generation and analysis assembly is configured to provide an electric current to one of the first probe and the pair of first probe-side contacting structures via the transmission line and to receive the electric current from the other of the first probe and the pair of first probe-side contacting structures via the transmission line.

10. The test system of claim 9, wherein the test system includes the signal generation and analysis assembly.

11. The test system of claim 1, wherein the test system is configured such that the pair of first probe-side contacting regions and the pair of first chuck-side contacting regions electrically contact one another and also such that the second probe-side contacting region and the second chuck-side contacting region electrically contact one another when electrical contact is selectively established between the first probe, the second probe, and the single contact pad on the DUT.

12. The test system of claim 1, wherein the test system further includes a contact engine that is configured to selectively establish the electrical communication between the pair of first chuck-side contacting regions and the pair of first probe-side contacting regions and also between the second probe-side contacting region and the second chuck-side contacting region.

13. The test system of claim 12, wherein the contact engine is configured to:
(i) selectively establish the electrical communication between the pair of first chuck-side contacting regions and the pair of first probe-side contacting regions independent from contact between the first probe, the second probe, and the single contact pad on the DUT; and
(ii) selectively establish the electrical communication between the second chuck-side contacting region and the second probe-side contacting region independent from contact between the first probe, the second probe, and the single contact pad on the DUT.

14. A method of electrically testing a device under test (DUT) utilizing the test system of claim 1, the method comprising:
   locating the substrate on the electrically conductive support surface, wherein the locating includes electrically contacting the second side of the DUT with the electrically conductive support surface;
   electrically contacting the single contact pad on the first side of the DUT with the first probe and the second probe of the probe head assembly;
   electrically contacting the pair of first probe-side contacting structures with the pair of first chuck-side contacting structures;
   electrically contacting the second probe-side contacting structure with the second chuck-side contacting structure;
   providing an electric current to one of the first probe and the pair of first probe-side contacting structures;
   receiving the electric current from the other of the first probe and the pair of first probe-side contacting structures; and
   measuring a voltage between the second probe and the electrically conductive support surface via the second chuck-side contacting structure and the second probe-side contacting structure.

15. The method of claim 14, wherein the providing includes providing the electric current to the pair of first probe-side contacting structures, and further wherein the receiving includes flowing the electric current from the pair of first probe-side contacting structures to the pair of first chuck-side contacting structures, from the pair of first chuck-side contacting structures to the electrically conductive support surface, from the electrically conductive support surface to the DUT, and from the DUT to the first probe.

16. The method of claim 14, wherein the providing includes providing the electric current to the first probe, and further wherein the receiving includes flowing the electric current from the first probe to the DUT, from the DUT to the electrically conductive support surface, from the electrically conductive support surface to the pair of first chuck-side contacting structures, and from the pair of first chuck-side contacting structures to the pair of first probe-side contacting structures.

17. The method of claim 14, wherein the providing the electric current includes providing an electric current of at least 10 amps.

18. A test system for electrically testing a device under test (DUT) that is formed on a substrate that includes a plurality of DUTs, wherein the DUT defines a first side and a second side that is opposed to the first side, the test system comprising:
   a probe head assembly that includes a first probe and a second probe that are configured to electrically contact a single contact pad on the first side of the DUT;
   a pair of first probe-side contacting structures that defines a pair of first probe-side contacting regions;
   a second probe-side contacting structure that defines a second probe-side contacting region;
   a chuck that includes an electrically conductive support surface that is configured to directly support the substrate and to directly electrically contact the second side of the DUT, wherein the probe head assembly and the chuck are configured to selectively translate relative to one another to selectively establish electrical contact between the probe and the DUT;
   a pair of first chuck-side contacting structures that defines a pair of first chuck-side contacting regions, wherein the pair of first chuck-side contacting structures is in electrical communication with the electrically conductive support surface, wherein the pair of first chuck-side contacting structures and the pair of first probe-side contacting structures are opposed to one another and are configured to selectively establish electrical communication between the pair of first chuck-side contacting regions and the pair of first probe-side contacting regions; and further wherein the pair of first chuck-side contacting structures is arranged at 180 degrees relative to one another, with the chuck extending therebetween; and
   a second chuck-side contacting structure that defines a second chuck-side contacting region, wherein the second chuck-side contacting structure is in electrical communication with the electrically conductive support surface, wherein the second chuck-side contacting structure and the second probe-side contacting structure are opposed to one another and are configured to selectively establish electrical communication between the second chuck-side contacting region and the second probe-side contacting region;
   wherein the test system is configured to provide a force signal to the DUT via the pair of first probe-side contacting structures, the pair of first chuck-side contacting structures, and the electrically conductive support surface and to receive the force signal from the DUT via the first probe;
   wherein the test system is configured to sense a voltage between the second probe and the electrically conductive support surface via the second chuck-side contacting structure and the second probe-side contacting structure; and
   wherein the test system further includes a contact engine that is configured to selectively establish the electrical communication between the pair of first chuck-side contacting regions and the pair of first probe-side contacting regions and also between the second probe-side contacting region and the second chuck-side contacting region, wherein the contact engine is configured to:
   (i) selectively establish the electrical communication between the pair of first chuck-side contacting regions and the pair of first probe-side contacting regions independent from contact between the first probe, the second probe, and the single contact pad on the DUT; and
   (ii) selectively establish the electrical communication between the second chuck-side contacting region and the second probe-side contacting region independent from contact between the first probe, the second probe, and the single contact pad on the DUT.

19. The test system of claim 18, wherein one of the second probe-side contacting region and the second chuck-side contacting region defines a planar contacting surface, and further wherein the other of the second probe-side-contacting region and the second chuck-side contacting region is defined by a compliant conductive member.

20. The test system of claim 18, wherein the second probe-side contacting region includes a planar contacting surface, wherein the substrate defines a first substrate surface that faces toward the probe head assembly and defines a first substrate surface area, wherein the planar contacting surface defines a planar contacting surface area, and further wherein the planar contacting surface area is matched to the first substrate surface area to within 25% of the first substrate surface area.

21. A method of electrically testing a device under test (DUT) utilizing the test system of claim 18, the method comprising:
- locating the substrate on the electrically conductive support surface, wherein the locating includes electrically contacting the second side of the DUT with the electrically conductive support surface;
- electrically contacting the single contact pad on the first side of the DUT with the first probe and the second probe of the probe head assembly;
- electrically contacting the pair of first probe-side contacting structures with the pair of first chuck-side contacting structures;
- electrically contacting the second probe-side contacting structure with the second chuck-side contacting structure;
- providing an electric current to one of the first probe and the pair of first probe-side contacting structures;
- receiving the electric current from the other of the first probe and the pair of first probe-side contacting structures; and
- measuring a voltage between the second probe and the electrically conductive support surface via the second chuck-side contacting structure and the second probe-side contacting structure.

* * * * *